(12) United States Patent
Wang et al.

(10) Patent No.: US 7,444,567 B2
(45) Date of Patent: Oct. 28, 2008

(54) METHOD AND APPARATUS FOR UNIFYING SELF-TEST WITH SCAN-TEST DURING PROTOTYPE DEBUG AND PRODUCTION TEST

(75) Inventors: Laung-Terng (L.-T.) Wang, Sunnyvale, CA (US); Xiaoqing Wen, Sunnyvale, CA (US); Khader S. Abdel-Hafez, San Francisco, CA (US); Shyh-Horng Lin, Taipei (TW); Hsin-Po Wang, Hsinchu (TW); Ming-Tung Chang, Changhua (TW); Po-Ching Hsu, Hsinchu (TW); Shih-Chia Kao, Taipei (TW); Meng-Chyi Lin, Taoyuan (TW); Chi-Chan Hsu, Hsinchu (TW)

(73) Assignee: Syntest Technologies, Inc., Sunnyvale, CA (US)

( * ) Notice: Subject to any disclaimer, the term of this patent is extended or adjusted under 35 U.S.C. 154(b) by 1390 days.

(21) Appl. No.: 10/406,592

(22) Filed: Apr. 4, 2003

(65) Prior Publication Data
US 2004/0268181 A1 Dec. 30, 2004

Related U.S. Application Data

(60) Provisional application No. 60/370,700, filed on Apr. 9, 2002.

(51) Int. Cl.
*G01R 31/28* (2006.01)
(52) U.S. Cl. ..................... 714/726; 714/731
(58) Field of Classification Search .......... None
See application file for complete search history.

(56) References Cited

U.S. PATENT DOCUMENTS

| 5,349,587 | A | | 9/1994 | Nadeau-Dostie et al. ... 371/22.3 |
| 5,680,543 | A | | 10/1997 | Bhawmik et al. ...... 395/183.06 |
| 5,878,055 | A | * | 3/1999 | Allen .......................... 714/744 |
| 6,327,684 | B1 | * | 12/2001 | Nadeau-Dostie et al. .... 714/731 |
| 6,327,687 | B1 | | 12/2001 | Rajski et al. ................ 714/731 |
| 6,442,722 | B1 | | 8/2002 | Nadeau-Dostie et al. .... 714/731 |
| 6,487,688 | B1 | * | 11/2002 | Nadeau-Dostie ............ 714/726 |

OTHER PUBLICATIONS

G. Hetherington, T. Fryars, N. Tamarapalli, M. Kassab, A. Hassan, and J. Rajski, "Logic BIST for Large Industrial Designs: Real Issues and Case Studies", Proc., IEEE International Test Conf., pp. 358-367, 1999.

\* cited by examiner

*Primary Examiner*—Christine T Tu
(74) *Attorney, Agent, or Firm*—Bacon & Thomas, PLLC

(57) ABSTRACT

A method and apparatus for testing or diagnosing faults in a scan-based integrated circuit using a unified self-test and scan-test technique. The method and apparatus comprises using a unified test controller to ease prototype debug and production test. The unified test controller further comprises using a capture clock generator and a plurality of domain clock generators each embedded in a clock domain to perform self-test or scan-test. The capture clocks generated by the capture clock generator are used to guide at-speed or reduced-speed self-test (or scan-test) within each clock domain. The frequency of these capture clocks can be totally unrelated to those of system clocks controlling the clock domains. This unified approach allows designers to test or diagnose stuck-type and non-stuck-type faults with a low-cost DFT (design-for-test) tester or a low-cost DFT debugger. A computer-aided design (CAD) method is further developed to realize the method and synthesize the apparatus.

18 Claims, 25 Drawing Sheets

US 7,444,567 B2

METHOD AND APPARATUS FOR UNIFYING SELF-TEST WITH SCAN-TEST DURING PROTOTYPE DEBUG AND PRODUCTION TEST

RELATED APPLICATION DATA

This application claims the benefit of U.S. Provisional Application No. 60/370,700 filed Apr. 9, 2002, which is hereby incorporated by reference.

BACKGROUND

In this specification, the term integrated circuit is used to describe a chip or MCM (multi-chip module) embedded with DFT (design-for-test) techniques.

The scan-based DFT technique in either a scan-test or a self-test environment is the most widely used method for producing high quality integrated circuits. The scan-based DFT technique requires that all storage elements existing in an integrated circuit, such as D flip-flops, be replaced with their scan-equivalent storage elements, such as Scan D flip-flops, otherwise known as scan cells. These scan cells are then connected to form one or more scan chains each controlled by one or more scan enable (SE) signals and scan clocks (SCKs) each belonging to a separate clock or frequency domain.

The testing of a scan-based integrated circuit proceeds in a sequence of shift and capture cycles, which are repeated for the desired number of test patterns. In order to distinguish between shift and capture cycles, a scan enable (SE) signal local to all scan cells in a clock domain is used to select either the shift path or the functional path as the path to provide a new value to update such a scan cell. In the shift cycle, the shift path is selected in order to shift in the desired test stimuli into scan cells belonging to all the different scan chains. In the capture cycle, the functional path is selected in order to update the scan cells with the test response from the combinational part of the integrated circuit.

Typically, in the scan-test environment, all test control signals including scan enable (SE) signals and scan clocks (SCKs) as well as test stimuli are provided externally from an ATE (automatic test equipment), and test responses are also collected and compared by an ATE. In the self-test environment, on the other hand, all test control signals are generated internally using a BIST (Built-In Self-Test) controller, which also includes the circuitry for internal generation and compaction of test stimuli and test responses using PRPGs (pseudo-random pattern generators) and MISRs (multiple-input signature registers), respectively. Related prior-art information can be found in books written by Abromovici et al. (1990), Nadeau-Dostie (2000), and Crouch (2000).

An added level of complexity arises when at-speed test is attempted to be performed on a scan-based integrated circuit. At-speed test can be implemented with either the last-shift launch methodology or the capture launch (double capture) methodology. When this is attempted in either a scan-test or a self-test environment, a new form of synchronization and timing waveforms are required for test controls and data signals in order for the test to be performed correctly. An additional level of complexity arises due to the numerous different implementations that have been used to implement at-speed test.

The following are examples of some of the prior-art solutions for testing or diagnosing an scan-based integrated circuit and their associated problems:

Prior-art scan-test solutions, documented in the book by Abromovici et al. (1990), suffer from the following problems: First, an ATE may need to provide many high-frequency scan enable (SE) signals and scan clocks (SCKs) to a scan-based integrated circuit in order to conduct at-speed test. In addition, to realize real at-speed test and to avoid clock-skew issues crossing clock domains, each clock domain may need to be provided with individual scan enable (SE) signals and scan clocks (SCKs). This will make the ATE complicated and expensive, which results in higher test costs. Second, even for reduced-speed scan-test or debug, it is not easy to conduct with simple hardware such as a low-cost DFT tester or debugger, because an ATE still needs to provide most of the test controls. Third, since different waveforms need to be generated for shift and capture cycles in order to address the test power issues and to target various fault types, the test controls needed from an ATE often become complicated. Therefore, it is clear that, if the interface between an ATE and a scan-based integrated circuit can be simplified, low-cost DFT testers or debuggers can be used. In addition, DFT design costs will also be reduced.

Prior-art self-test solutions, documented in U.S. Pat. No. 5,349,587 issued to Nadeau-Dostie (1994), U.S. Pat. No. 5,680,543 issued to Bhawmik (1997), U.S. Pat. No. 6,327,684 issued to Nadeau-Dostie (2001), and the paper co-authored by Hetherington et al. (2000), suffer from the following problem: a BIST controller often needs to be re-designed once different requirements arise related to the test power and test type issues. This will complicate the BIST design flow and design costs will also increase.

From the previous discussion, it is also clear that, while there has been extensive work done on implementing the numerous flavors of scan-based tests, there has not been enough work done on implementing these tests in a way that they can co-exist together in the same circuit for both scan-test and self-test. In fact, most of the current implementations require adopting a design methodology that is completely aware of the type of the specific scan-based test implementation, and precludes other implementations from being easily implemented in the same circuit. This is also a reason for escalating test design costs.

Thus, there is a need to implement an improved method and apparatus for unifying self-test with scan-test that allows designers to implement reduced-speed test as well as different flavors of at-speed test by generating the necessary test control signals for shift and capture cycles. The basic idea is to implement the test control functions common to both scan-test and self-test with a special piece of circuitry to be embedded in a scan-based integrated circuit. This way, the test interface with an ATE or a BIST controller can be greatly simplified. The method and apparatus devised based on this idea not only unifies scan-test and self-test but also allows a low-cost DFT tester or a low-cost DFT debugger to be used for testing or diagnosing a scan-based integrated circuit.

SUMMARY

Accordingly, a primary objective of the present invention is to provide an improved DFT (design-for-test) system for unifying self-test and scan-test using a unified test controller. Such a DFT system comprises a method and apparatus for using a unified test controller to ease prototype debug and production test. The present invention further comprises a computer-aided design (CAD) system that synthesizes such a DFT system and generates desired HDL (hardware description language) test benches and ATE (automatic test equipment) test programs. The unified test controller technique specified in the present invention is summarized as follows:

The unified test controller contains a capture clock generator, a capture phase selector, a test type selector, and a plurality of domain clock generators each embedded in a clock domain for generating scan enable (SE) signals and scan clocks (SCKs) to perform either self-test or scan-test.

(1) Capture Clock Generator

The capture clock generator has three sets of inputs: a global scan enable (GSE) signal, a test clock, and a plurality of capture phase selection signals. The GSE signal can be provided externally from an ATE or generated internally by a TAP (test access port) controller as specified by a Boundary-scan Standard such as the IEEE 1149.1 Std. It is used to define the boundary between shift and capture cycles for all clock domains. The test clock is provided from an ATE, either as a TCK clock in a Boundary-scan design or as a direct external test clock. The desired test clock can be selected by a clock type selector. The capture phase selection signals are used to determine the capture order for the clock domains.

The capture clock generator generates a plurality of capture clocks (CCKs) in response to the GSE signal, the test clock, and a plurality of capture phase selection signals. These capture clocks (CCKs) are used to guide at-speed or reduced-speed self-test (or scan-test) within each clock domain. The frequency of these capture clocks (CCKs) can be totally unrelated to those of system clocks controlling the clock domains.

(2) Capture Phase Selector

The capture phase selector can be a shift register, which is chained together with the test type selector to form one single shift register. This shift register can be accessed through the TDI (Test data in) port in a Boundary-scan design. The values shifted into the capture phase selector are used to generate a plurality of capture phase selection signals, which are used to determine the capture order for the clock domains.

(3) Test Type Selector

The test type selector can be a shift register, which is chained together with the capture phase selector to form one single shift register. This shift register can be accessed through the TDI (Test data in) port in a Boundary-scan design. The values shifted into the test type selector are used to generate a plurality of test type selection signals, which are used to determine the type of faults, either stuck-type or non-stuck-type, to be targeted.

(4) Domain Clock Generator

There are a plurality of domain clock generators, each embedded in one clock domain. A domain clock generator has four sets of inputs: a global scan enable (GSE) signal, a capture clock (CCK), a system clock, and a test type selection signal. The GSE signal can be provided externally from an ATE or generated internally by a TAP controller. It is used to define the boundary between shift and capture cycles for all clock domains. The capture clock (CCK) is provided from the capture clock generator. The test type selection signal is used to determine the type of faults, either stuck-type or non-stuck-type, to be targeted.

The domain clock generator generates a scan enable (SE) signal as well as a scan clock (SCK) for the corresponding clock domain. This generation is guided by the GSE signal and the capture clock (CCK). The generated scan enable (SE) signal and the scan clock (SCK) can be used to perform shift cycles with either non-overlapping or overlapping waveforms. In addition, the generated scan enable (SE) signal and the scan clock (SCK) can be used to detect or locate either stuck-type or non-stuck-type faults in scan-test or self-test. Stuck-type faults include stuck-at faults, bridging faults, and IDDQ (IDD Quiescent) faults; while non-stuck-type faults include transition faults using last-shift launch, transition faults using capture launch (double capture), path-delay faults using last-shift launch, path-delay faults using capture launch (double capture), multiple-cycle delay faults using last-shift launch, and multiple-cycle delay faults using capture launch (double capture). In addition, both at-speed test and reduced-speed (slow-speed) test can be conducted.

The advantages of using a unified test controller in scan-test and self-test are as follows:

First, a unified test controller is general in the sense that it can be used for both scan-test and self-test. It implements the test control tasks common to both scan-test and self-test. Once a unified test controller is designed, it will be easy to use it in implementing either scan-test or self-test.

Second, using a unified test controller greatly reduces the DFT design efforts in order to accommodate various test requirements. Basically, the function of a unified test controller can be programmable with some shift registers used to select test clock types, capture phase types, and test types. With a unified test controller, it becomes unnecessary to re-design test controls either on an ATE or in a BIST (Built-In Self-Test) controller.

Third, a unified test controller implements the test control tasks common to both scan-test and self-test as hardware means embedded in a scan-based integrated circuits. This greatly simplifies the function and performance required on an ATE. As a result, a low-cost DFT tester or DFT debugger can be easily implemented.

To summarize, the present invention uses a unified test controller technique. The unified test controller comprises a capture clock generator and a plurality of domain clock generators each embedded in a clock domain to perform self-test or scan-test. The capture clocks (CCKs) generated by the capture clock generator are used to guide at-speed or reduced-speed self-test (or scan-test) within each clock domain by providing proper scan enable (SE) signals and scan clocks (SCKs). The frequency of these capture clocks (CCKs) can be totally unrelated to those of system clocks controlling the clock domains. The present invention unifies scan-test and self-test and makes it possible to test or diagnose both stuck-type and non-stuck-type faults with an ATE, a low-cost DFT tester, or a low-cost DFT debugger. The present invention also includes a computer-aided design (CAD) method developed to realize the method and synthesize the unified test controller.

THE BRIEF DESCRIPTION OF DRAWINGS

The above and other objects, advantages and features of the invention will become more apparent when considered with the following specification and accompanying drawings wherein.

Figure 6:
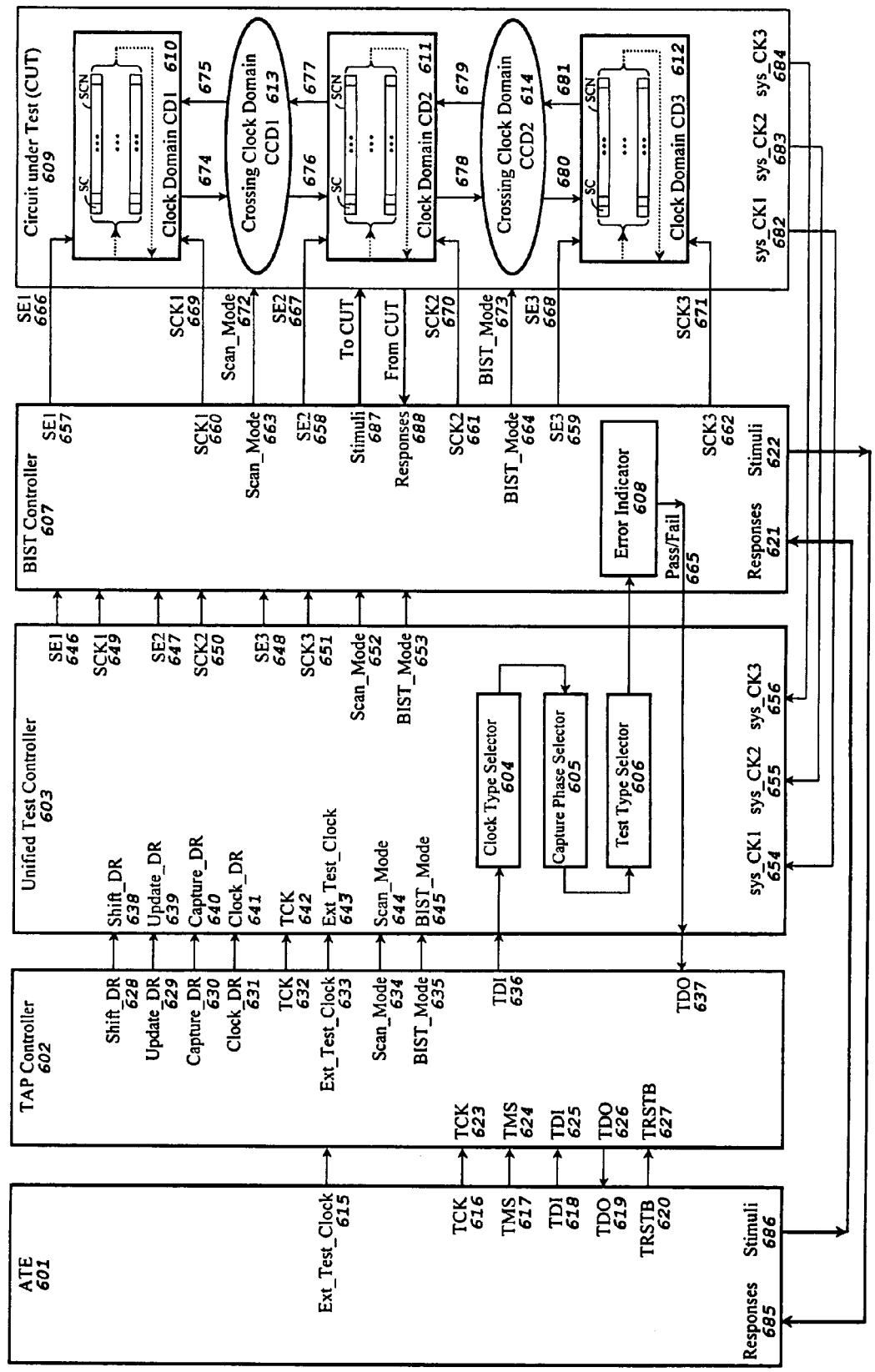
Figure 7:
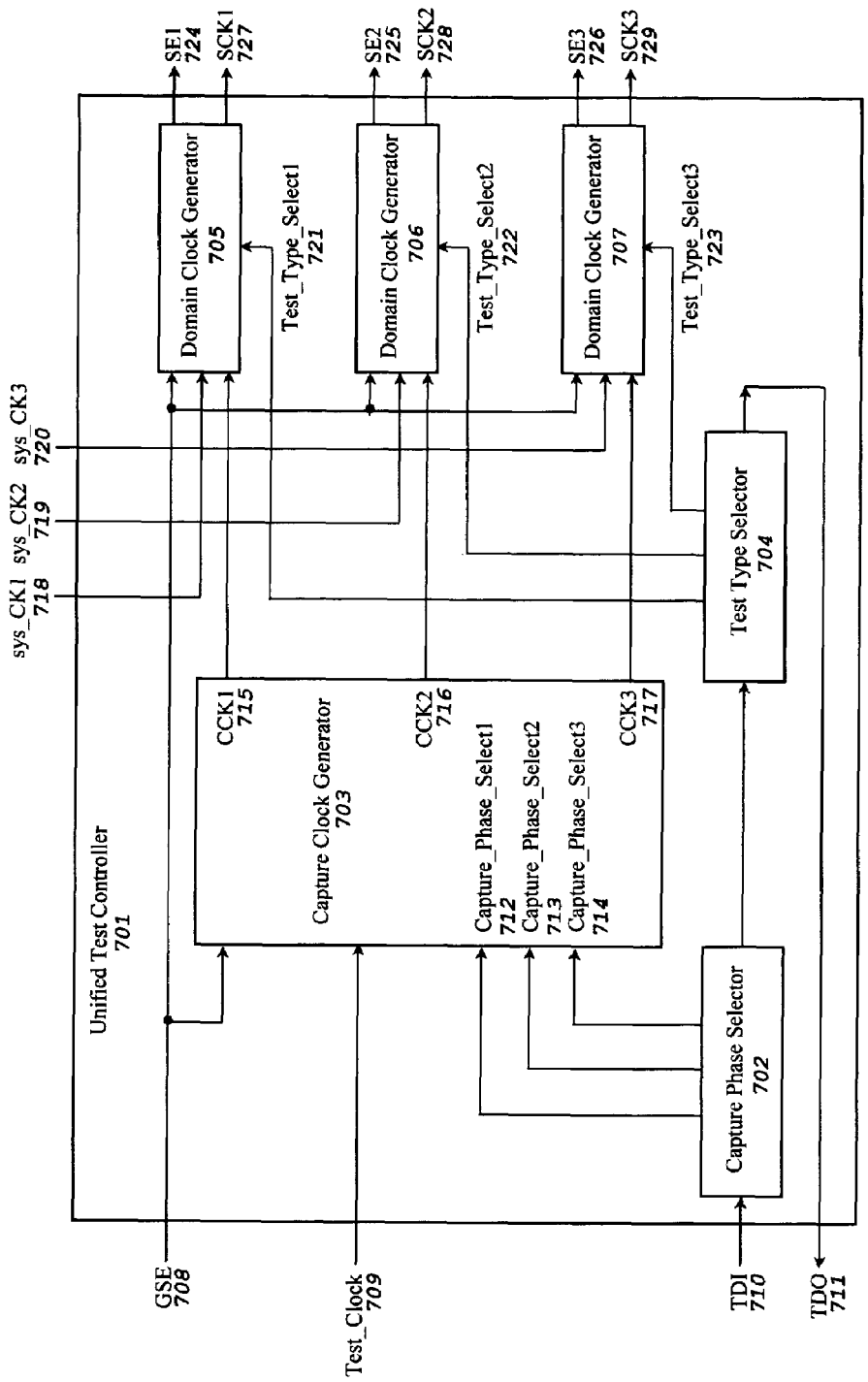
Figure 8:
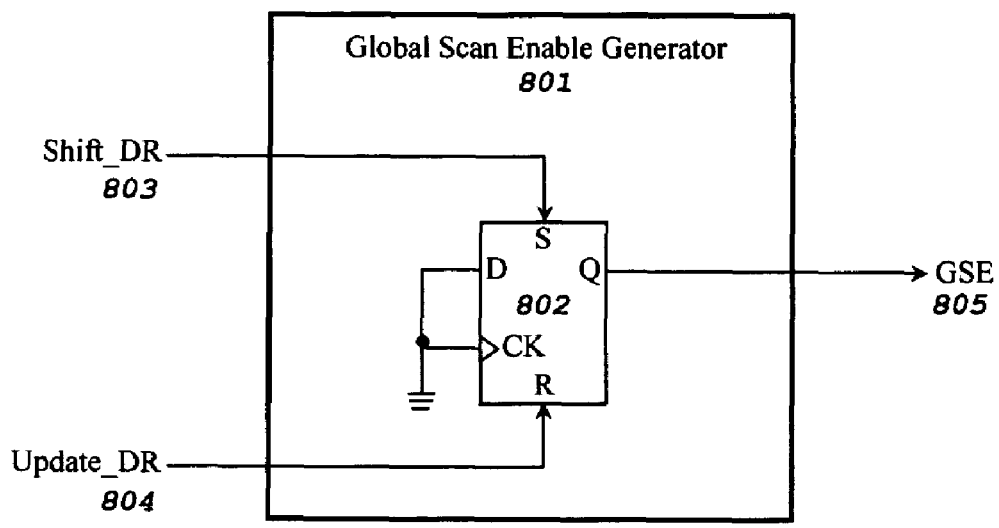
Figure 9:
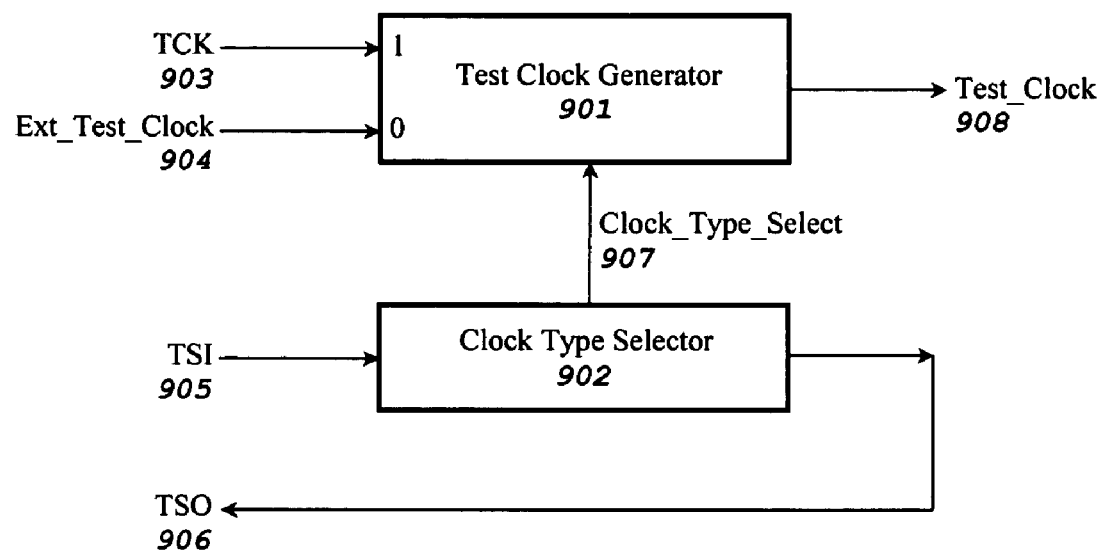
Figure 10A:
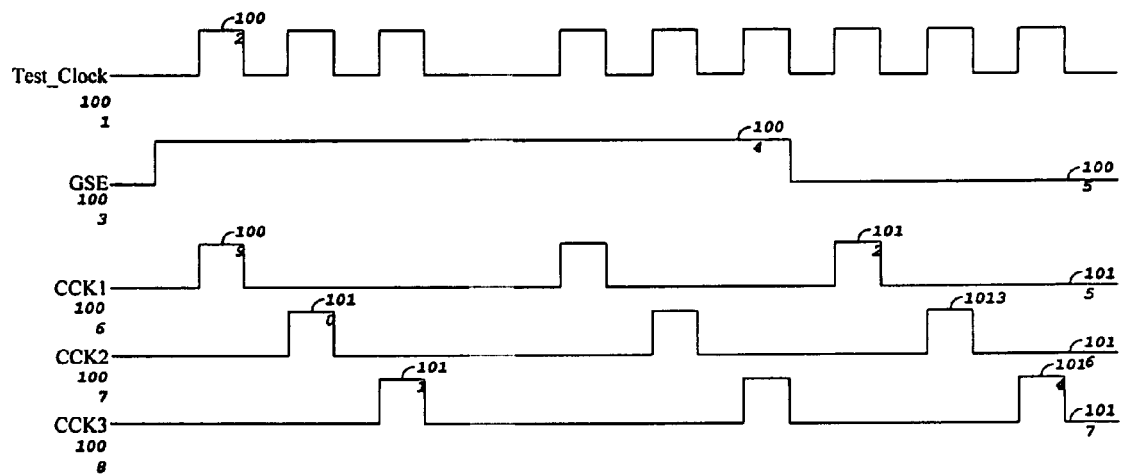
Figure 10B:
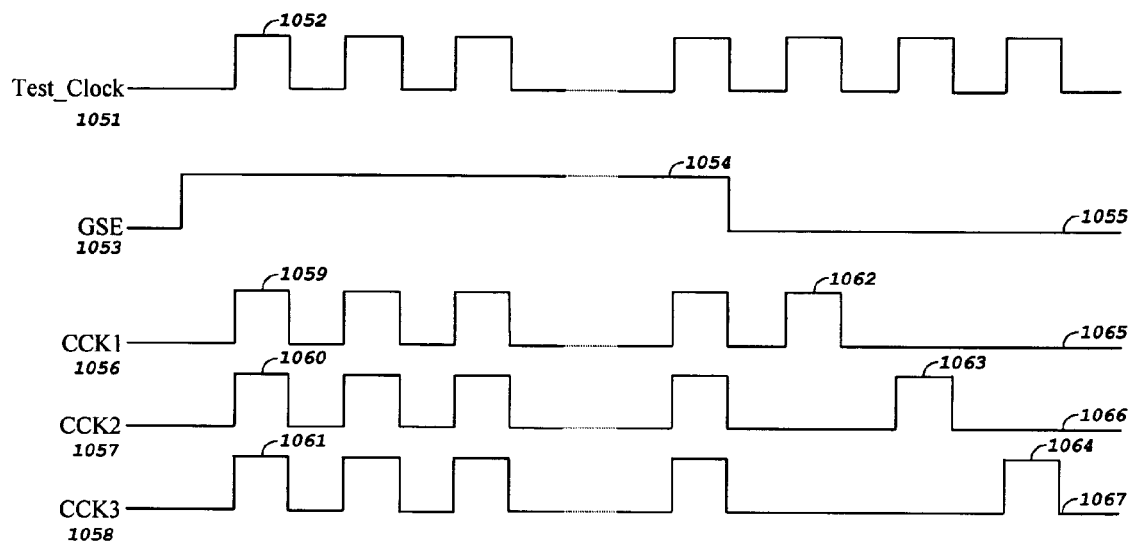
Figure 11A:
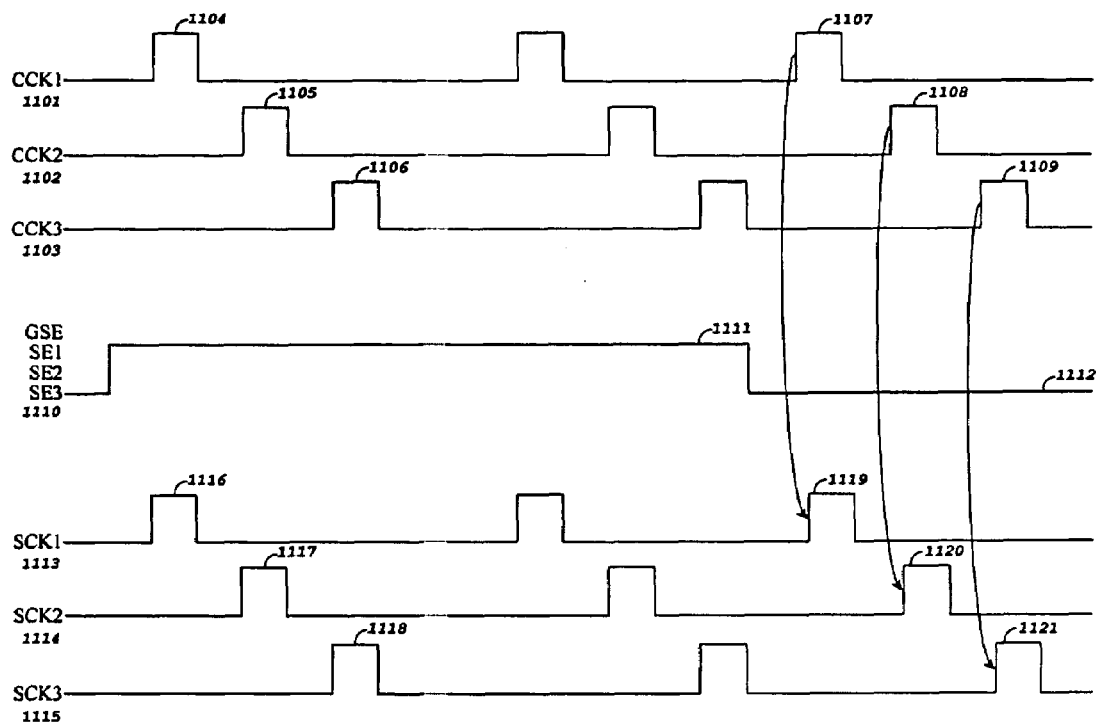
Figure 11B:
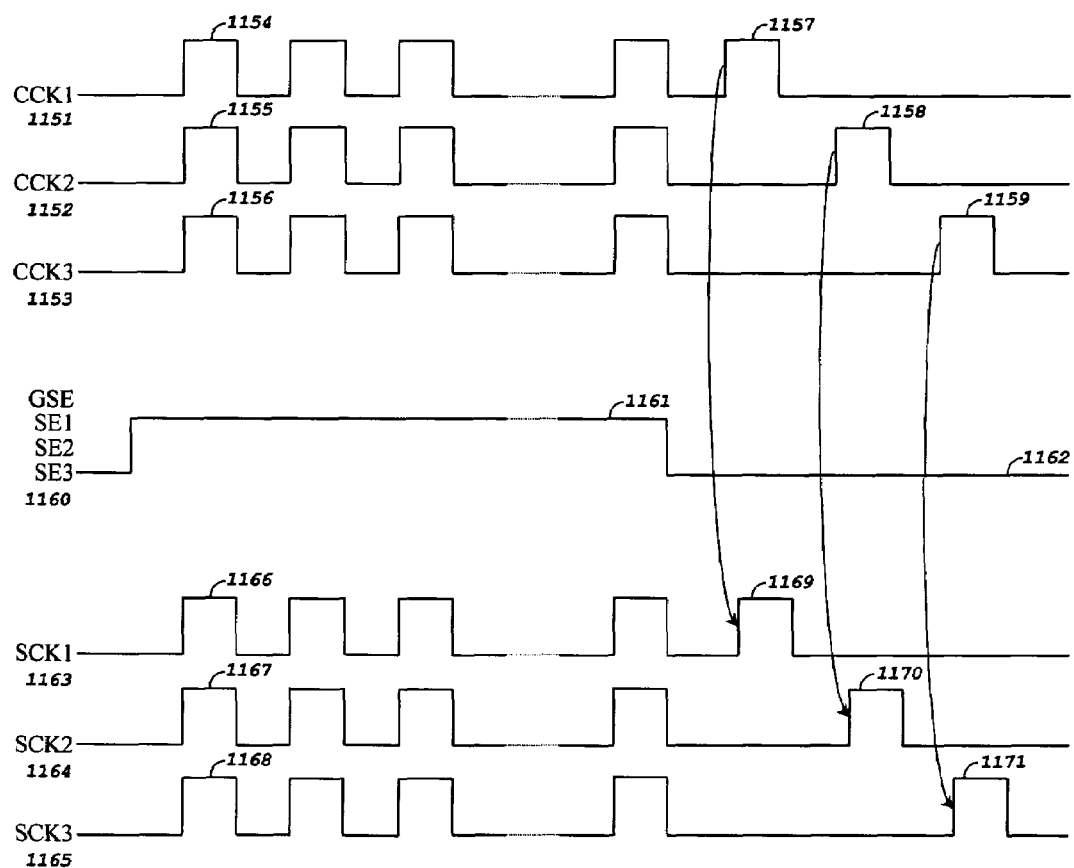
Figure 12A:
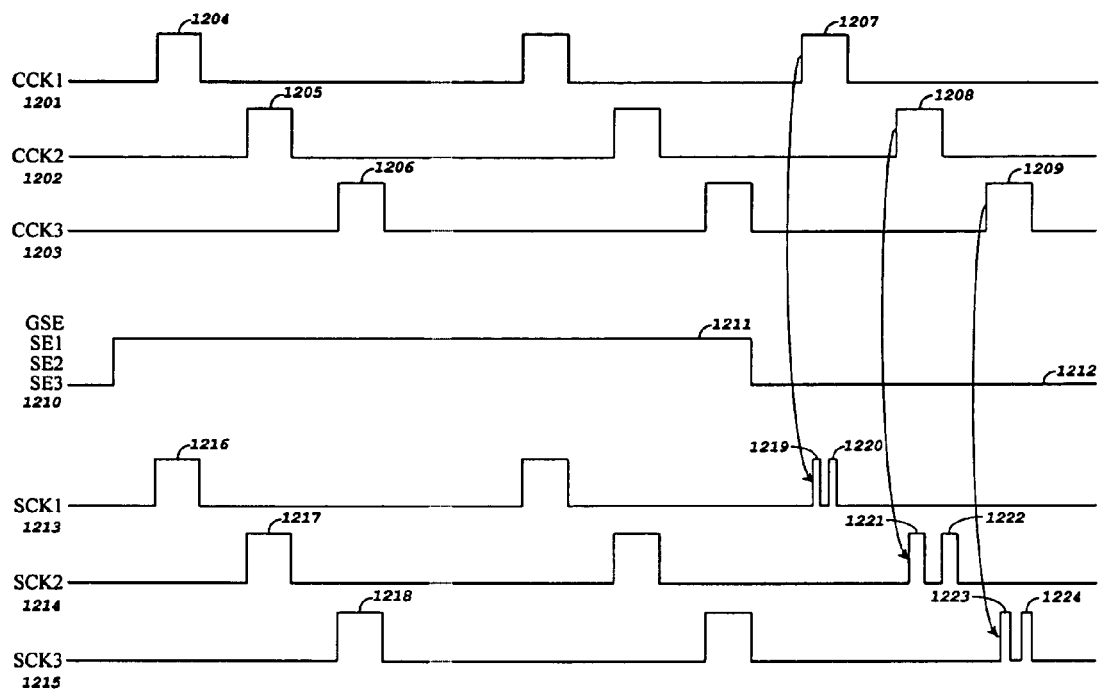
Figure 12B:
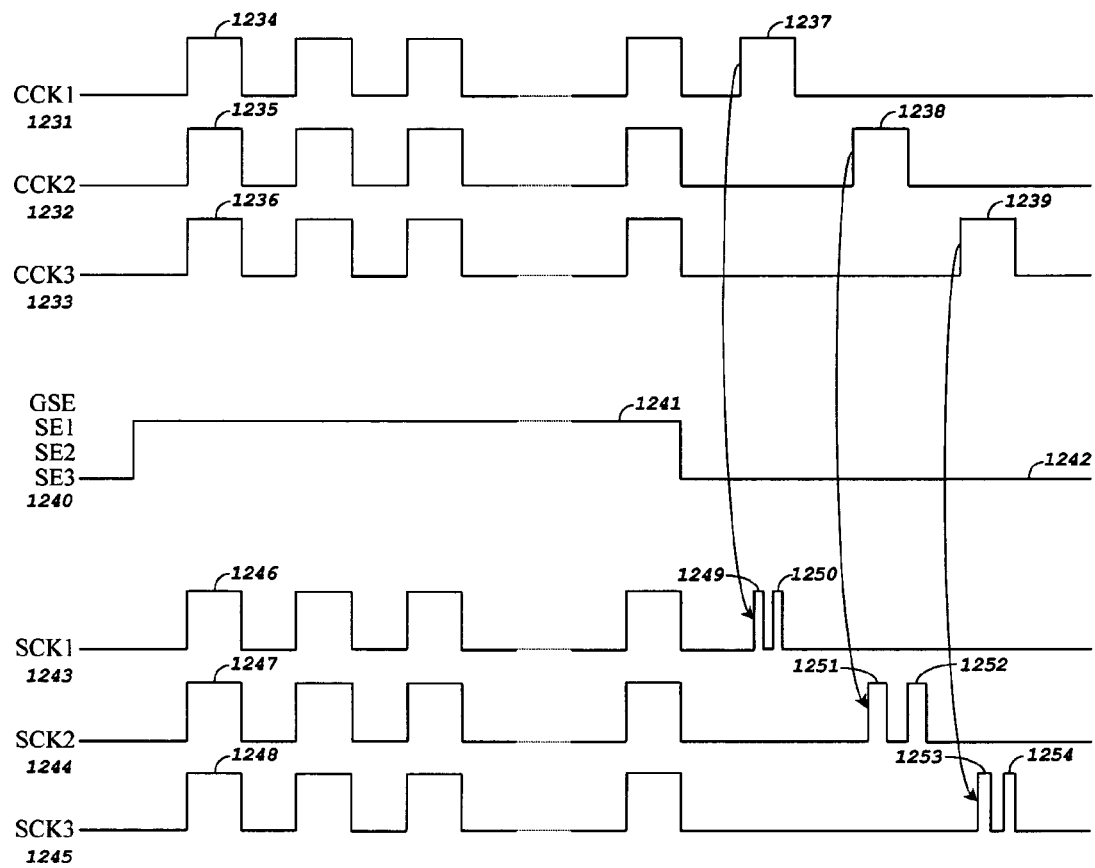
Figure 12C:
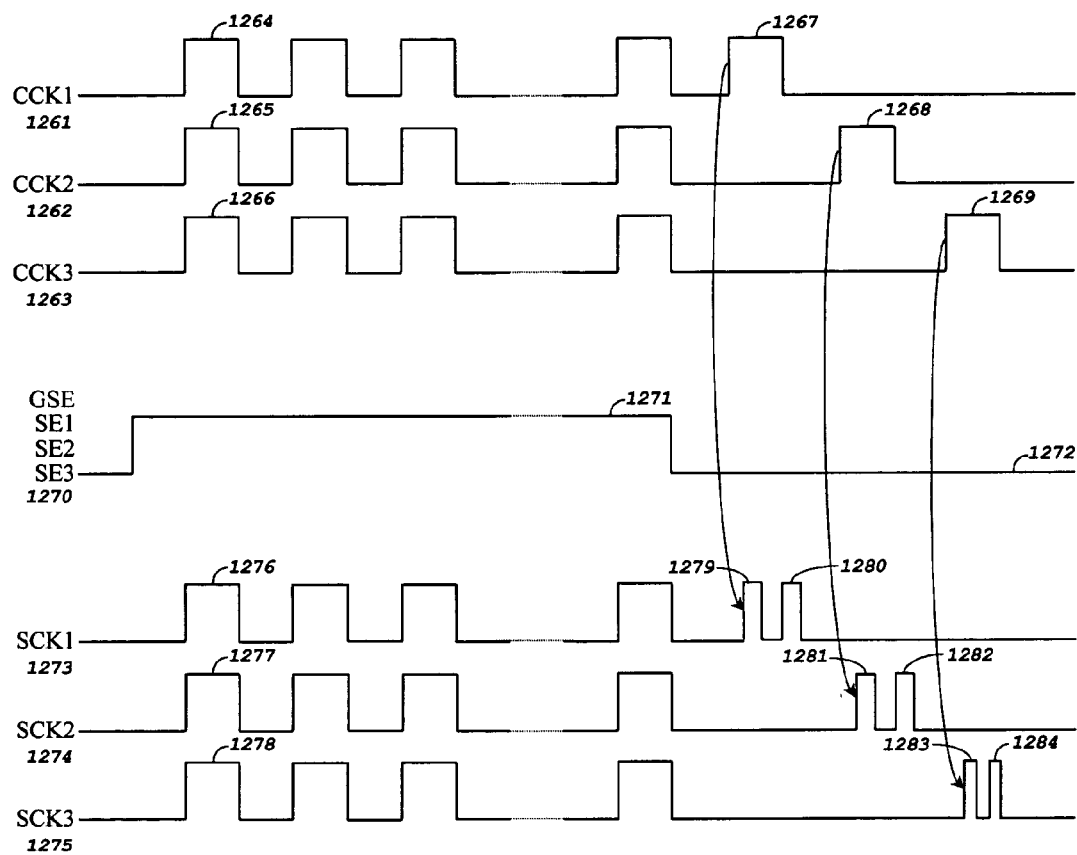
Figure 13A:
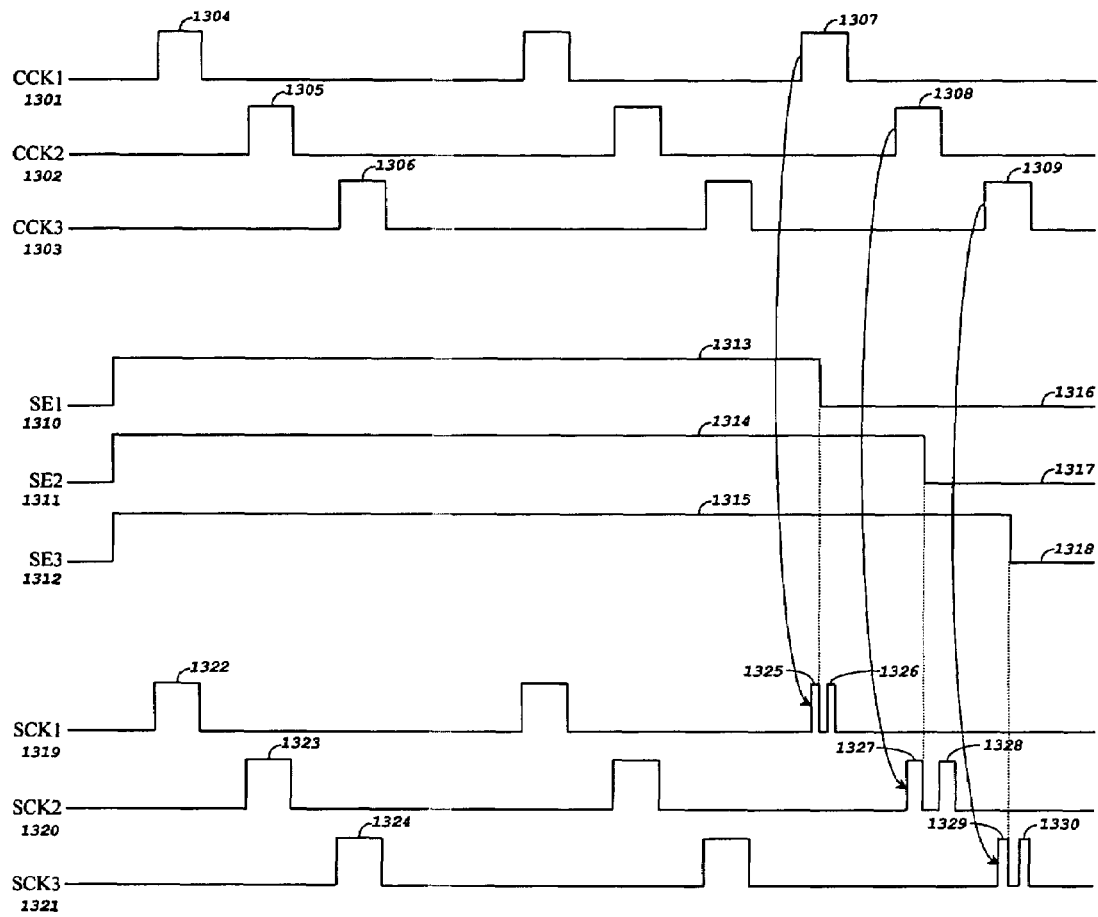
Figure 13B:
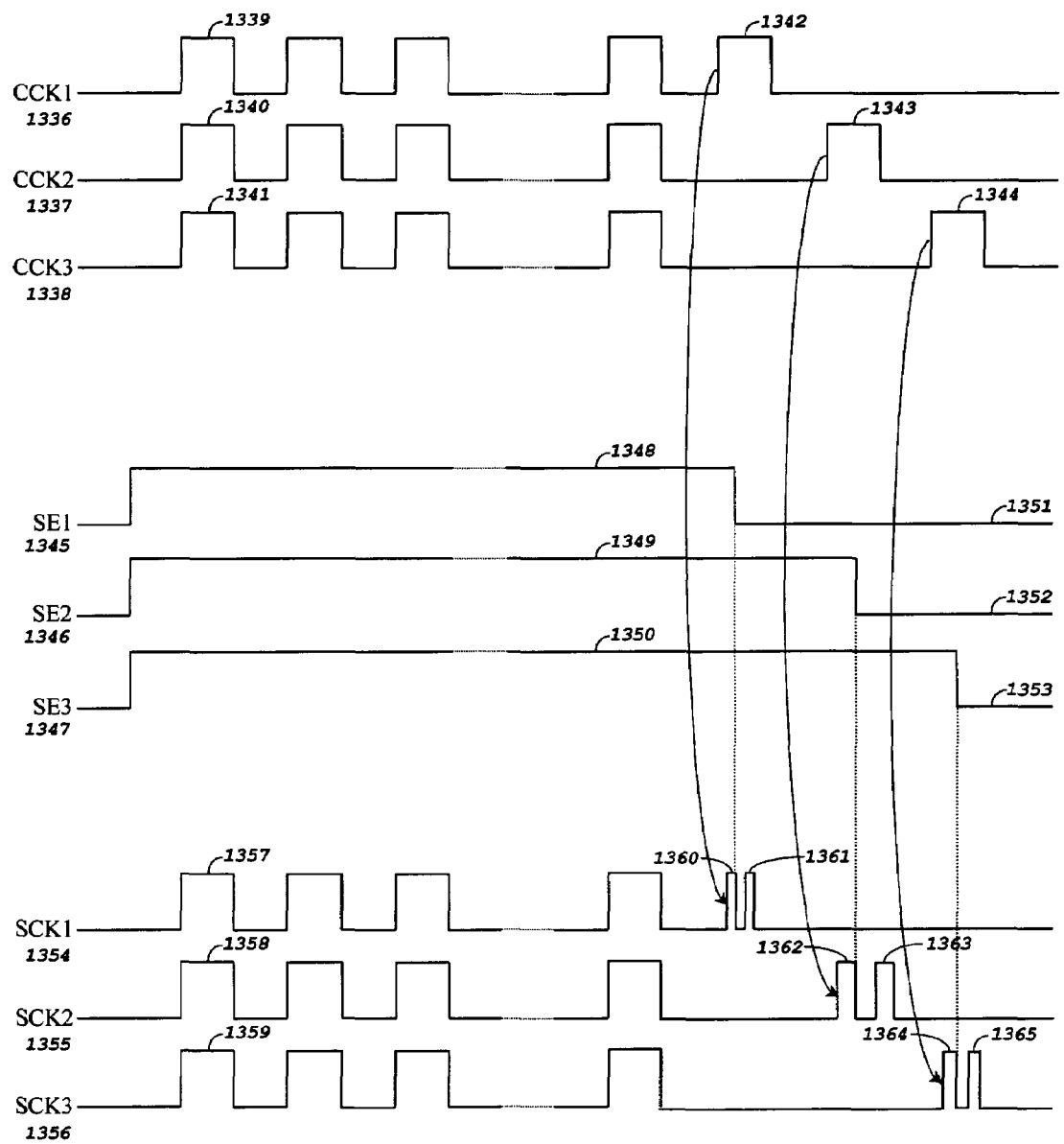
Figure 13C:
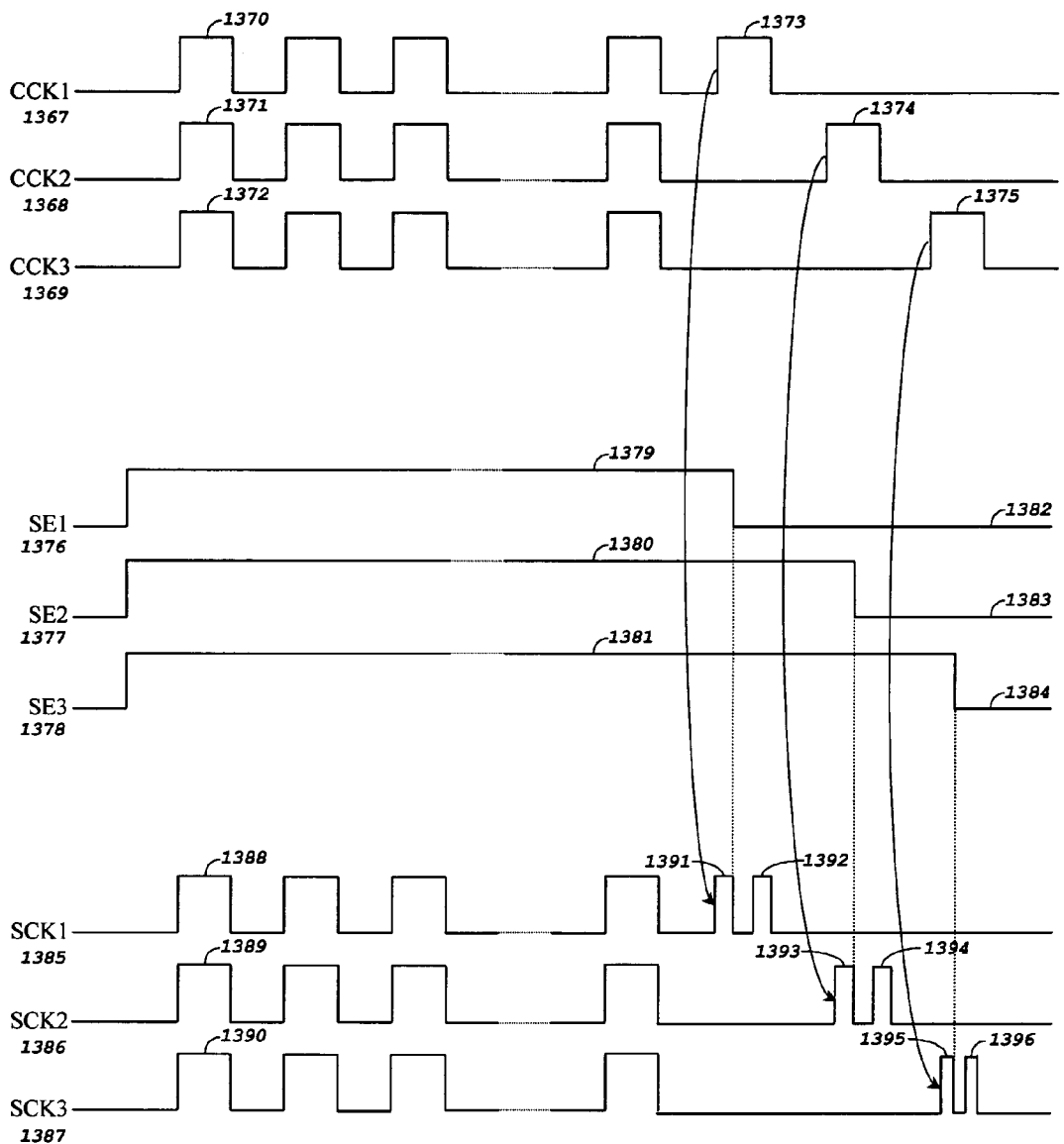
Figure 14A:
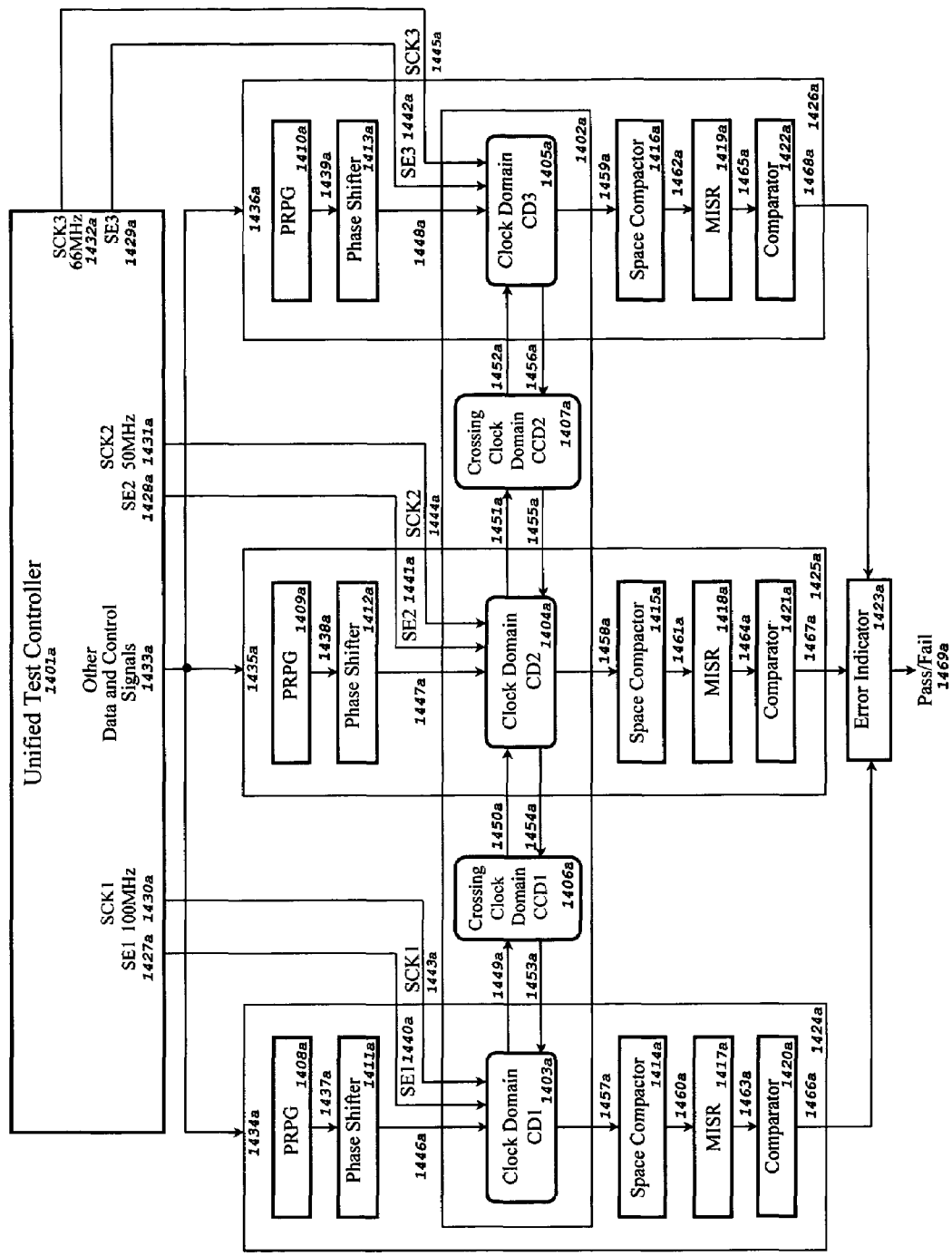
Figure 14B:
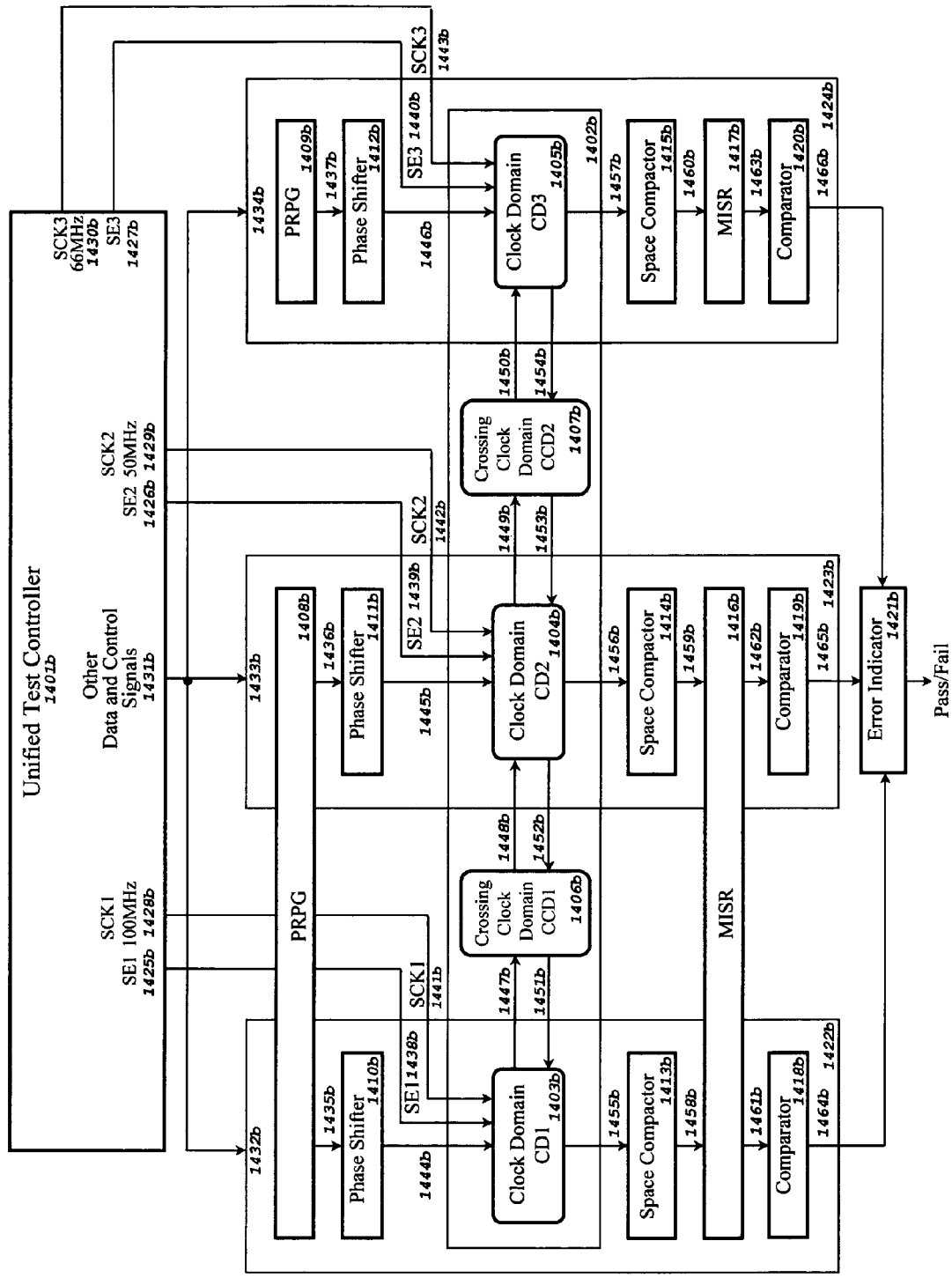
Figure 14C:
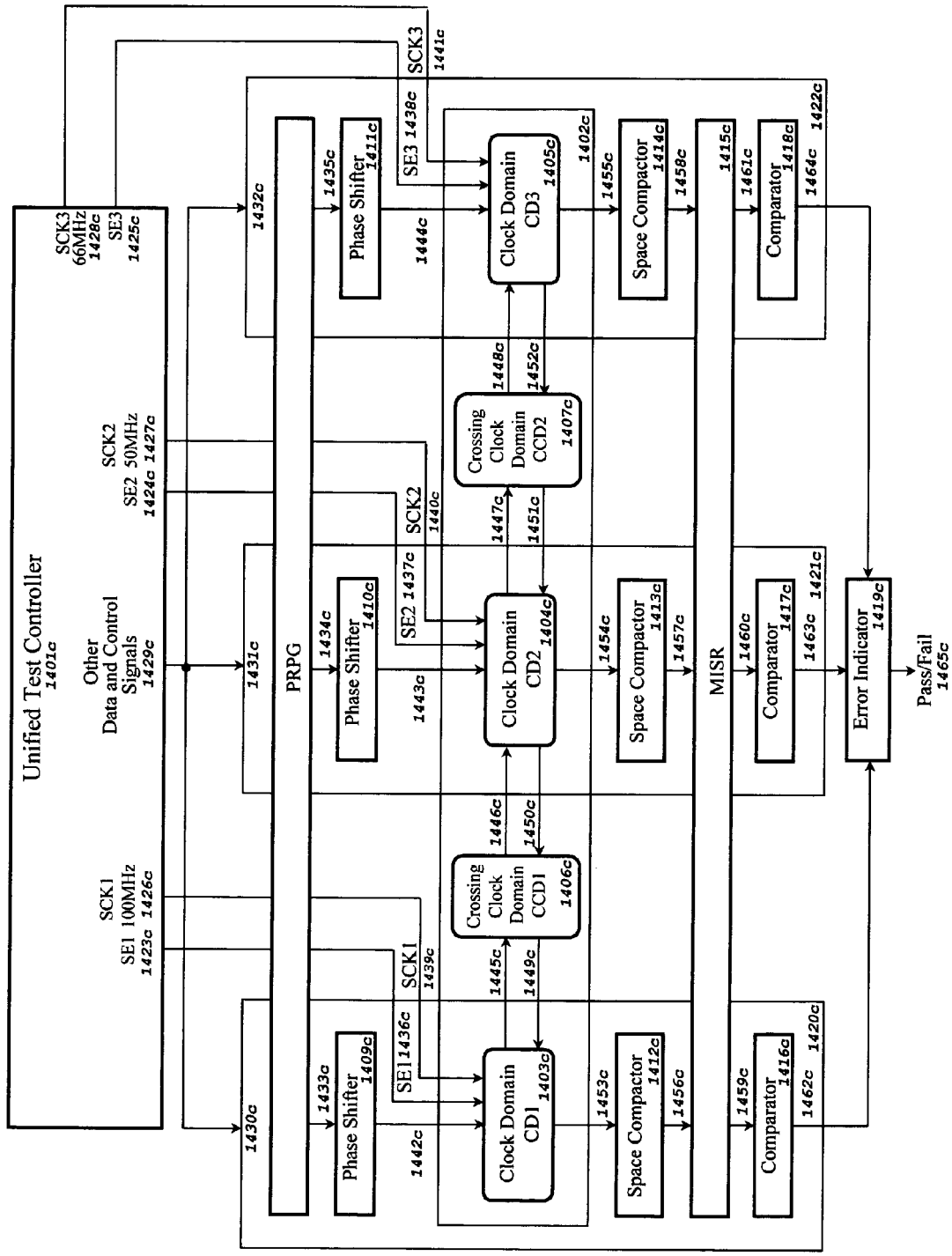
Figure 14D:
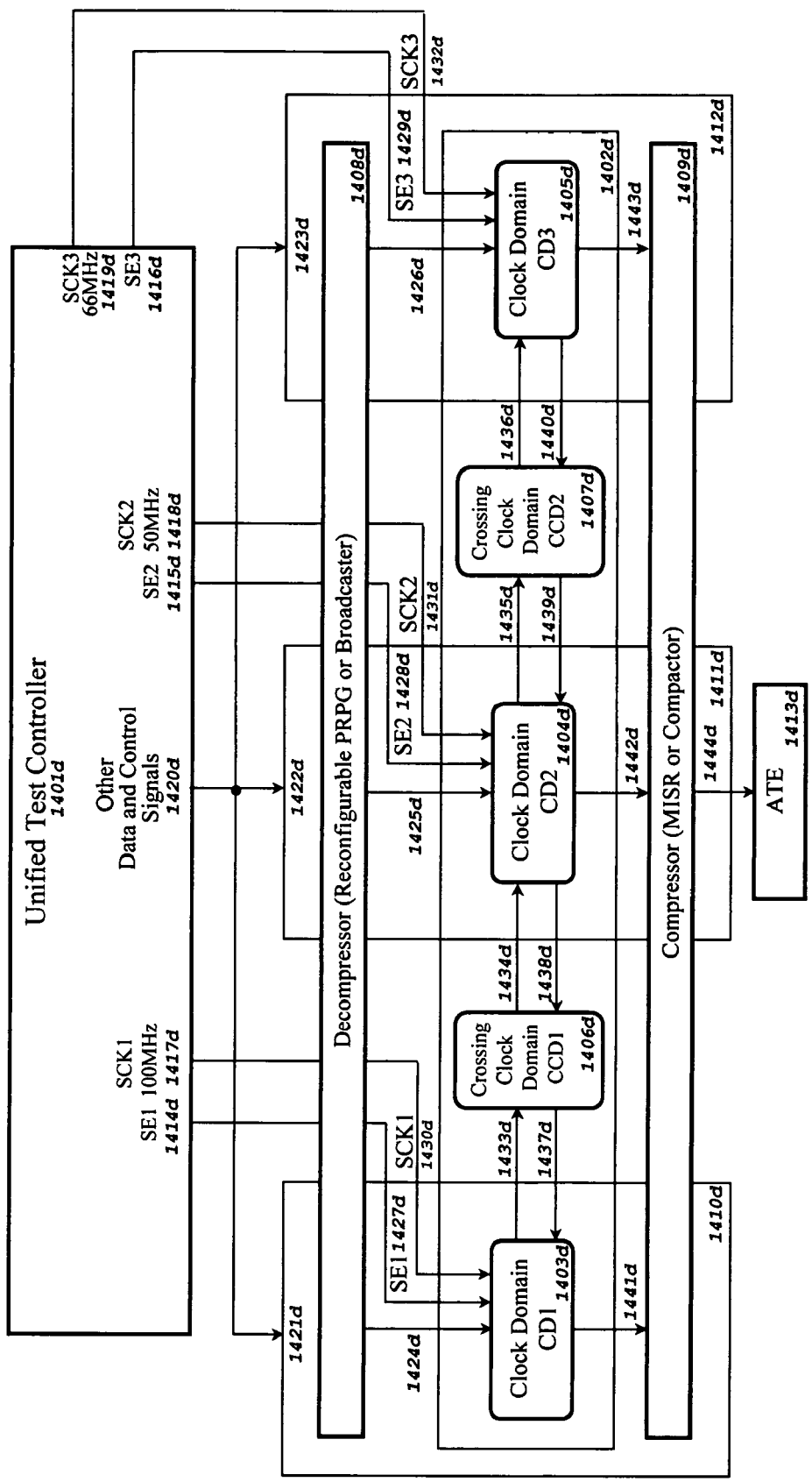
Figure 15:
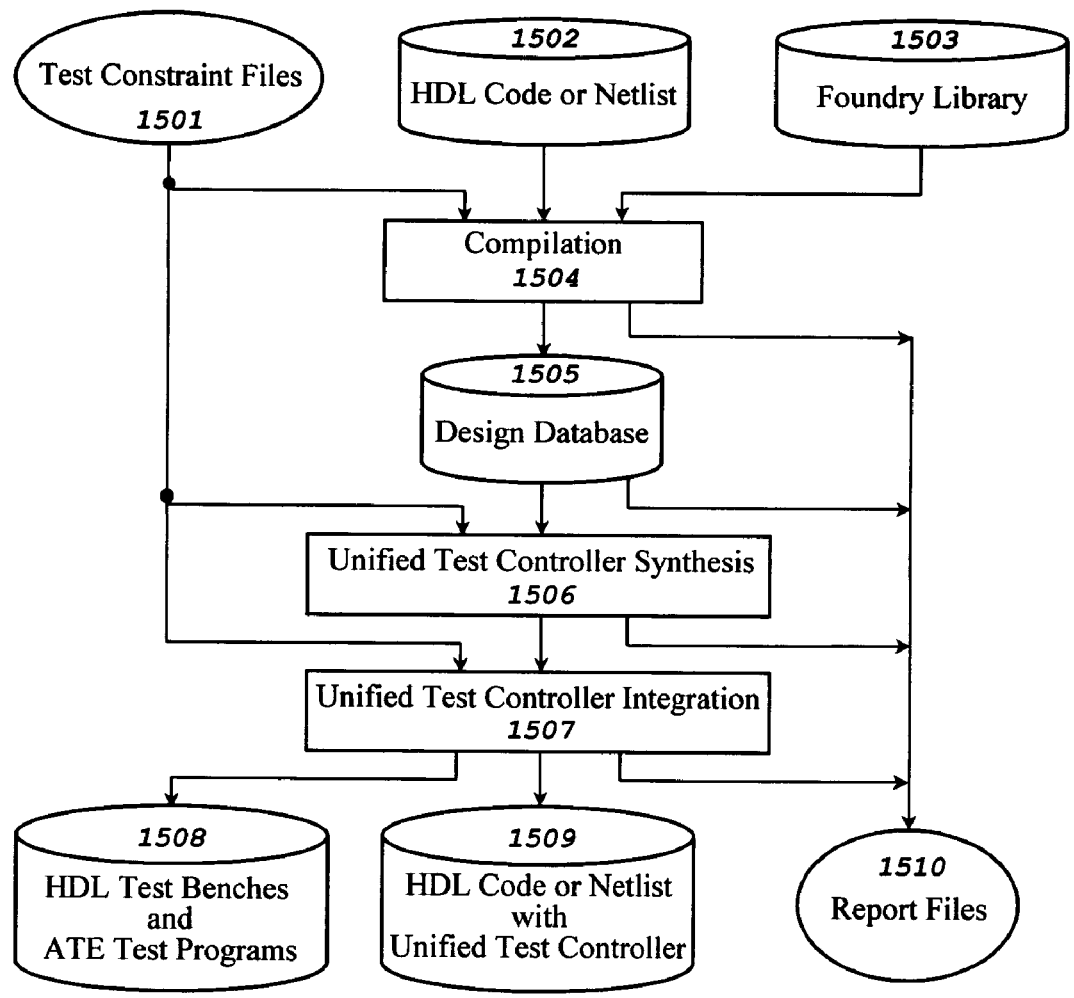
Figure 16:
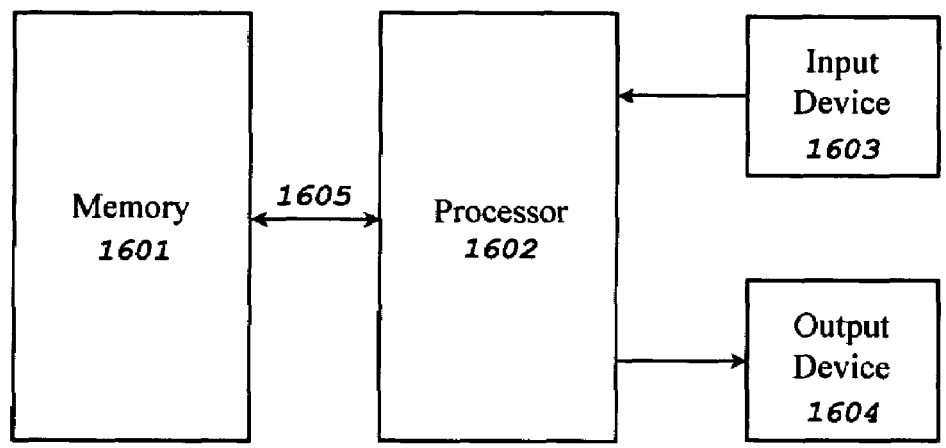

FIG. 6 shows an example full-scan or partial-scan integrated circuit with three clock domains and three system clocks, where a unified test controller, in accordance with the present invention and controlled by an ATE (automatic test equipment) through a TAP (test access port) controller, is used to detect or locate stuck-type or non-stuck-type faults at reduced-speed or at-speed in self-test mode;

FIG. 7 shows a block diagram of a unified test controller, in accordance with the present invention, consisting of a capture clock generator, a capture phase selector, a test type selector, and three domain clock generators, each for generating the scan enable (SE) signal and the scan clock (SCK) for each of the three clock domains;

FIG. 8 shows a block diagram of a global scan enable generator of one embodiment of the present invention to generate a global scan enable (GSE) signal;

FIG. 9 shows a block diagram of a test clock generator and a clock type selector of one embodiment of the present invention to generate a test clock;

FIG. 10A shows the waveforms of three capture clocks (CCKs), non-overlapping in both shift and capture cycles, generated by the capture clock generator shown in FIG. 7, in accordance with the present invention;

FIG. 10B shows the waveforms of three capture clocks (CCKs), overlapping in the shift cycle but non-overlapping in the capture cycle, generated by the capture clock generator shown in FIG. 7, in accordance with the present invention;

FIG. 11A shows the waveforms of three scan clocks (SCKs), non-overlapping in both shift and capture cycles, generated by the domain clock generators shown in FIG. 7, in accordance with the present invention, to detect or locate stuck-type faults in self-test or scan-test mode;

FIG. 11B shows the waveforms of three scan clocks (SCKs), overlapping in the shift cycle but non-overlapping in the capture cycle, generated by the domain clock generators shown in FIG. 7, in accordance with the present invention, to detect or locate stuck-type faults in self-test or scan-test mode;

FIG. 12A shows the waveforms of three scan clocks (SCKs), non-overlapping in both shift and capture cycles, generated by the domain clock generators shown in FIG. 7, in accordance with the present invention, to detect or locate non-stuck-type faults at-speed with the capture launch (double capture) scheme in self-test or scan-test mode;

FIG. 12B shows the waveforms of three scan clocks (SCKs), overlapping in the shift cycle but non-overlapping in the capture cycle, generated by the domain clock generators shown in FIG. 7, in accordance with the present invention, to detect or locate non-stuck-type faults at-speed with the capture launch (double capture) scheme in self-test or scan-test mode;

FIG. 12C shows the waveforms of three scan clocks (SCKs), overlapping in the shift cycle but non-overlapping in the capture cycle, generated by the domain clock generators shown in FIG. 7, in accordance with the present invention, to detect or locate 2-cycle delay faults at-speed with the capture launch (double capture) scheme in self-test or scan-test mode;

FIG. 13A shows the waveforms of three scan clocks (SCKs), non-overlapping in both shift and capture cycles, generated by the domain clock generators shown in FIG. 7, in accordance with the present invention, to detect or locate non-stuck-type faults at-speed with the last-shift launch scheme in self-test or scan-test mode;

FIG. 13B shows the waveforms of three scan clocks (SCKs), overlapping in the shift cycle but non-overlapping in the capture cycle, generated by the domain clock generators shown in FIG. 7, in accordance with the present invention, to detect or locate non-stuck-type faults at-speed with the last-shift launch scheme in self-test or scan-test mode;

FIG. 13C shows the waveforms of three scan clocks (SCKs), overlapping in the shift cycle but non-overlapping in the capture cycle, generated by the domain clock generators shown in FIG. 7, in accordance with the present invention, to detect or locate 2-cycle delay faults at-speed with the last-shift launch scheme in self-test or scan-test mode;

FIG. 14A shows a block diagram of a unified test controller and three pairs of PRPGs (pseudo-random pattern generators) and MISRs (multiple-input signature registers), in accordance with the present invention, which are used to test or diagnose a scan-based integrated circuit with three clock domains in self-test mode;

FIG. 14B shows a block diagram of a unified test controller and two pairs of PRPGs (pseudo-random pattern generators) and MISRs (multiple-input signature registers), in accordance with the present invention, which are used to test or diagnose a scan-based integrated circuit with three clock domains in self-test mode;

FIG. 14C shows a block diagram of a unified test controller and one pair of PRPG (pseudo-random pattern generator) and MISR (multiple-input signature register), in accordance with the present invention, which are used to test or diagnose a scan-based integrated circuit with three clock domains in self-test mode;

FIG. 14D shows a block diagram of a unified test controller and one decompressor-compressor pair, in accordance with the present invention, which are used to test or diagnose a scan-based integrated circuit with three clock domains in scan-test mode;

FIG. 15 shows the flow diagram of a computer-readable program in a computer-readable memory, in accordance with the present invention, to cause a computer system to perform a method for synthesizing a unified test controller for testing or diagnosing a plurality of clock domains in a scan-based integrated circuit in self-test or scan-test mode; and FIG. 16 shows an electronic design automation system, where a computer-readable program, in accordance with the present invention, performs a method for synthesizing a unified test controller for testing or diagnosing a plurality of clock domains in a scan-based integrated circuit in self-test or scan-test mode.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
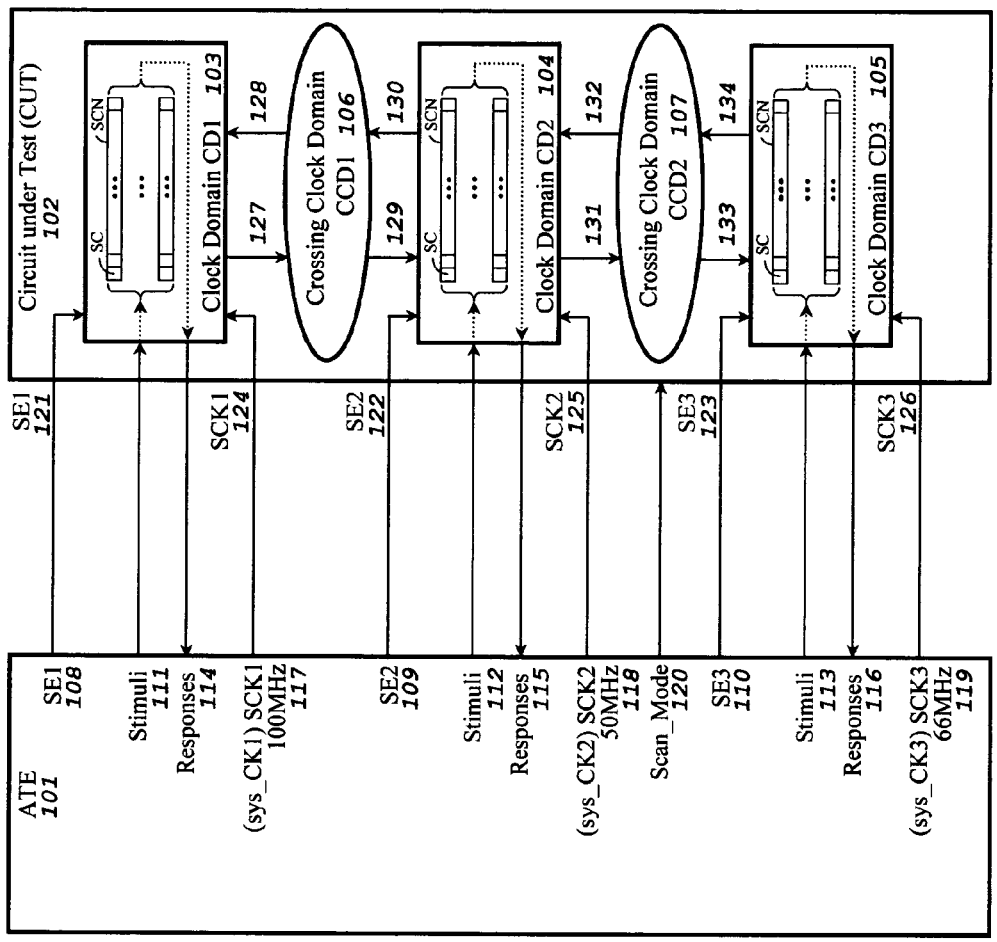
FIG. 1 shows a prior-art example full-scan or partial-scan integrated circuit with three clock domains and three system clocks, where a conventional ATE (automatic test equipment) is used to detect or locate stuck-type or non-stuck-type faults in scan-test mode.

FIG. 1 shows a prior-art example full-scan or partial-scan integrated circuit or circuit under test (CUT) 102 with three clock domains, CD1 103 to CD3 105, and three system clocks, sys_CK1 117 to sys_CK3 119. Each system clock controls one clock domain. Furthermore, CD1 103 and CD2 104 interact with each other through the crossing clock-domain logic block CCD1 106. CD2 104 and CD3 105 interact with each other through the crossing clock-domain logic block CCD2 107. In addition, the CUT 102 is a scan-based integrated circuit. That is, all or part of its storage cells are replaced with scan cells SC and all scan cells SC are connected into one or more scan chains SCN.

A conventional ATE (automatic test equipment) 101 is used to detect or locate stuck-type or non-stuck-type faults in scan-test mode. The ATE 101 provides both scan enable (SE) signals, SE1 108 to SE3 110, as well as scan clocks (SCKs), SCK1 117 to SCK3 119, to the CUT 102. During the shift cycle, stimuli, 111 to 113, will be shifted into all scan cells SC through all scan chains SCN within the three clock domains CD1 103 to CD3 105 simultaneously. Note that the shift cycle can operate either at its rated clock speed (at-speed) or at any reduced clock speed (reduced-speed). After the shift cycle is completed, functional clocks are applied to all or part of the three clock domains to capture test responses into scan cells SC. During the capture cycle, each clock can operate either at-speed or at reduced-speed. After the capture cycle is completed, the test responses, 114 to 116, captured by all scan cells SC are shifted out through scan chains SCN for direct comparison at the ATE 101.

The three clock domains, CD1 103 to CD3 105, are originally designed to operate at 100 MHz, 50 MHz, and 66 MHz, respectively. During self-test or scan-test, the ATE 101 will take over the control of all system clocks. Based on power management requirements and target test types, the ATE 101 will provide proper clock waveforms for scan clocks (SCKs), SCK1 117 to SCK3 119.

Note that a conventional ATE should provide all test control signals including scan enable (SE) signals and scan clocks. In addition, the ATE should also provide test stimuli and analyze test responses. This is the key reason why a conventional ATE is complicated and expensive.

Figure 2:
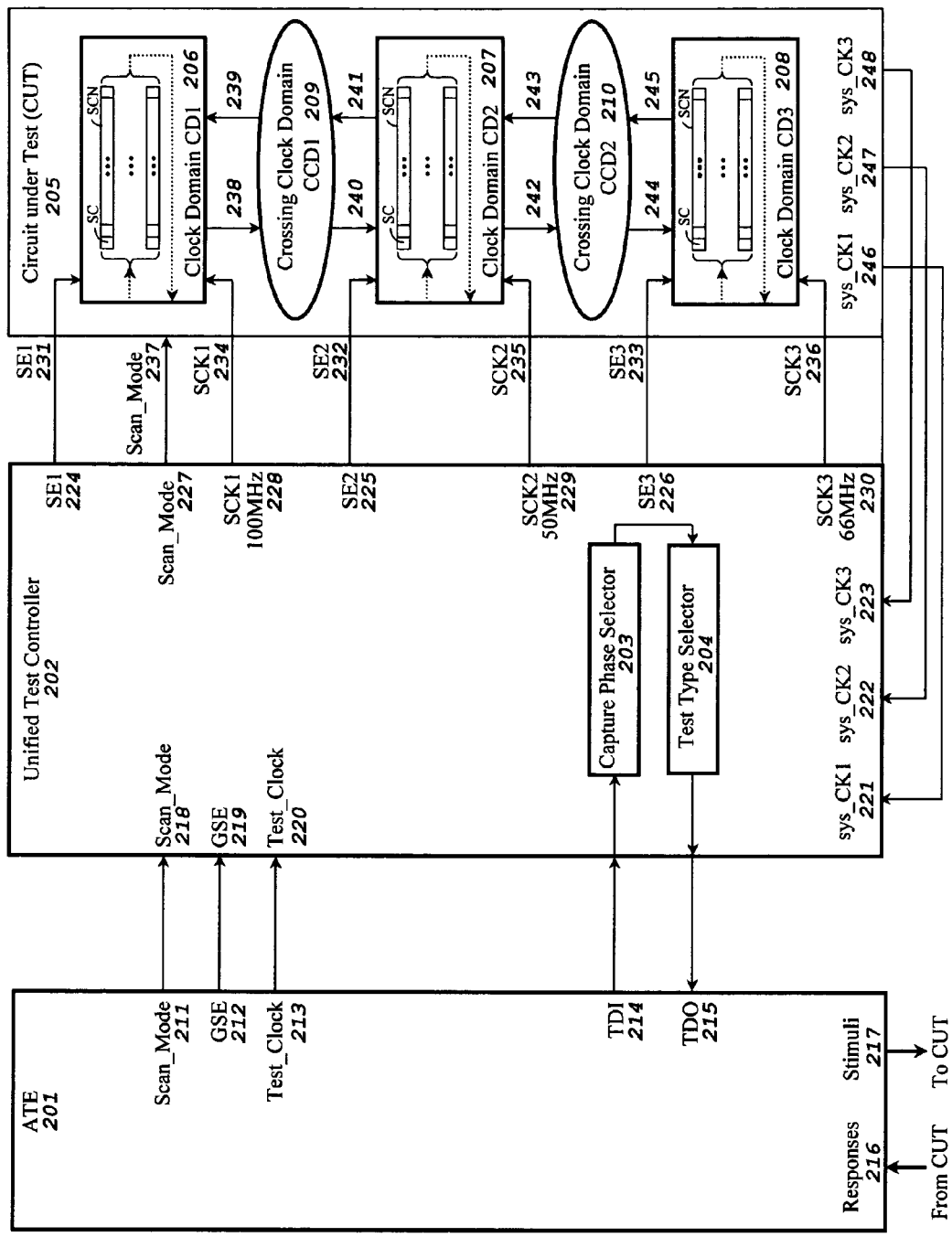
FIG. 2 shows an example full-scan or partial-scan integrated circuit with three clock domains and three system clocks, where a unified test controller, in accordance with the present invention and controlled directly by an ATE (automatic test equipment), is used to detect or locate stuck-type or non-stuck-type faults in scan-test mode.

FIG. 2 shows an example full-scan or partial-scan integrated circuit or circuit under test (CUT) 205 with three clock domains, CD1 206 to CD3 208, and three system clocks, sys_CK1 246 to sys_CK3 248, where a unified test controller 202, in accordance with the present invention and controlled directly by an ATE (automatic test equipment) 201, is used to detect or locate stuck-type or non-stuck-type faults in scan-test mode.

The ATE 201 provides test stimuli 217 to the CUT 205 and compares test responses 216 from the CUT 205 with expected values to determine if the CUT 205 is faulty or not. The ATE 201 also provides a scan mode signal Scan_Mode 211, a global scan enable signal GSE 212, and a test clock Test_Clock 213 to the unified test controller 202.

The unified test controller 202 passes the scan mode signal from the ATE 201 to the CUT 205. In addition, it generates three scan enable (SE) signals, SE1 224 to SE3 226, and three scan clocks (SCKs), SCK1 228 to SCK3 230, for the three clock domains, CD1 206 to CD3 208, respectively. These scan enable (SE) signals and scan clocks (SCKs) are generated in response to the global scan enable signal GSE 219, the test clock Test_Clock 220, and system clocks, sys_CK1 221 to sys_CK3 223. The unified test controller 202 also has two shift registers: a capture phase selector 203 and a test type selector 204. These two shift registers are chained together and can be accessed from the ATE 201 through the TDI (Test data in) 214 and TDO (Test data out) 215 ports. Depending on the value of the capture phase selector 203, the capture order determined by the phases of the scan clocks (SCKs), SCK1 228 to SCK3 230, can be selected. Depending on the value of the test type selector 204, waveforms for scan clocks (SCKs), SCK1 228 to SCK3 230, can be generated to detect or locate either stuck-type or non-stuck-type faults.

With the use of the unified test controller 202, the function of the ATE 201 can be dramatically simplified since scan test control signals, including scan enable (SE) signals and scan clocks (SCKs) for all clock domains, can now be generated by the unified test controller 202 instead of the ATE 201. This makes it possible to use a low-cost DFT (design-for-test) tester or a low-cost DFT debugger to test or diagnose a scan-based integrated circuit with large size and high complexity.

Figure 3:
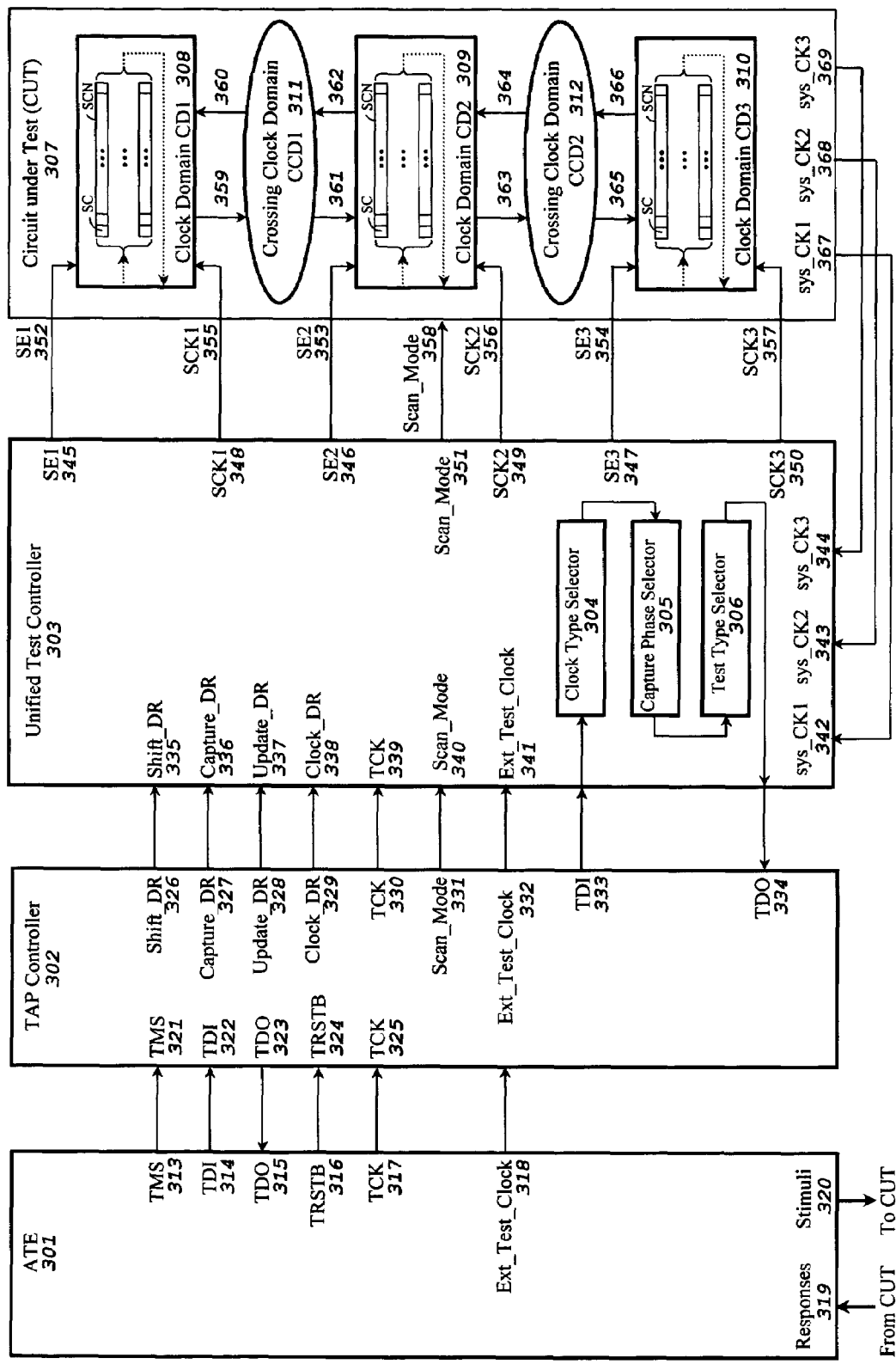
FIG. 3 shows an example full-scan or partial-scan integrated circuit with three clock domains and three system clocks, where a unified test controller, in accordance with the present invention and controlled by an ATE (automatic test equipment) through a TAP (test access port) controller, is used to detect or locate stuck-type or non-stuck-type faults in scan-test mode.

FIG. 3 shows an example full-scan or partial-scan integrated circuit or circuit under test (CUT) 307 with three clock domains, CD1 308 to CD3 310, and three system clocks, sys_CK1 367 to sys_CK3 369, where a unified test controller 303, in accordance with the present invention and controlled by an ATE (automatic test equipment) 301 through a TAP (test access port) controller 302, is used to detect or locate stuck-type or non-stuck-type faults in scan-test mode.

The ATE 301 provides test stimuli 320 to the CUT 307 and compares test responses 319 from the CUT 307 with expected values to determine if the CUT 307 is faulty or not. The ATE 301 also provides an external test clock Ext_Test_Clock 318 as well as a standard five-pin TAP interface, TMS (Test mode select) 313, TDI (Test data in) 314, TDO (Test data out) 315, TCK (Test clock) 317, and optionally TRSTB (Test reset) 316, to the unified test controller 303.

The TAP controller 302 generates a scan mode signal Scan_Mode 331 for the CUT 307 from the values shifted-in from the ATE 301 through the TDI 322 port. In addition, it generates Shift_DR 326, Capture_DR 327, Update_DR 328, and Clock_DR 329 signals for the unified test controller 303. These signals are used to generate an internal global scan enable (GSE) signal for the unified test controller 303.

The unified test controller 303 generates three scan enable (SE) signals, SE1 345 to SE3 347, and three scan clocks (SCKs), SCK1 348 to SCK3 350, for the three clock domains, CD1 308 to CD3 310, respectively. These scan enable (SE) signals and scan clocks (SCKS) are generated in response to an internal global scan enable (GSE) signal, the TCK clock 339, the external test clock Ext_Test_Clock 341, and system clocks, sys_CK1 342 to sys_CK3 344. The unified test controller 303 also has three shift registers: a clock type selector 304, a capture phase selector 305, and a test type selector 306. These three shift registers are chained together and can be accessed from the TAP controller 302 through the TDI 333 and TDO 334 ports. Depending on the value of the clock type selector 304, either the TCK clock 339 or the external test clock Ext_Test_Clock 341 can be selected as an internal test clock. Depending on the value of the capture phase selector 305, the capture order determined by the phases of the scan clocks (SCKs), SCK1 348 to SCK3 350, can be selected. Depending on the value of the test type selector 306, waveforms for scan clocks (SCKs), SCK1 348 to SCK3 350, can be generated to detect or locate either stuck-type or non-stuck-type faults.

With the use of the unified test controller 303 together with the TAP controller 302, the function of the ATE 301 can be further simplified since scan test control signals, including scan enable (SE) signals and scan clocks (SCKs) for all clock domains, can now be generated by the unified test controller 303 instead of the ATE 301. The ATE 301 only needs to provide some initial control values and a TCK clock through a standard TAP interface. This makes it possible to use a low-cost DFT (design-for-test) tester or a low-cost DFT debugger to test or diagnose a scan-based integrated circuit with large size and high complexity.

Figure 4:
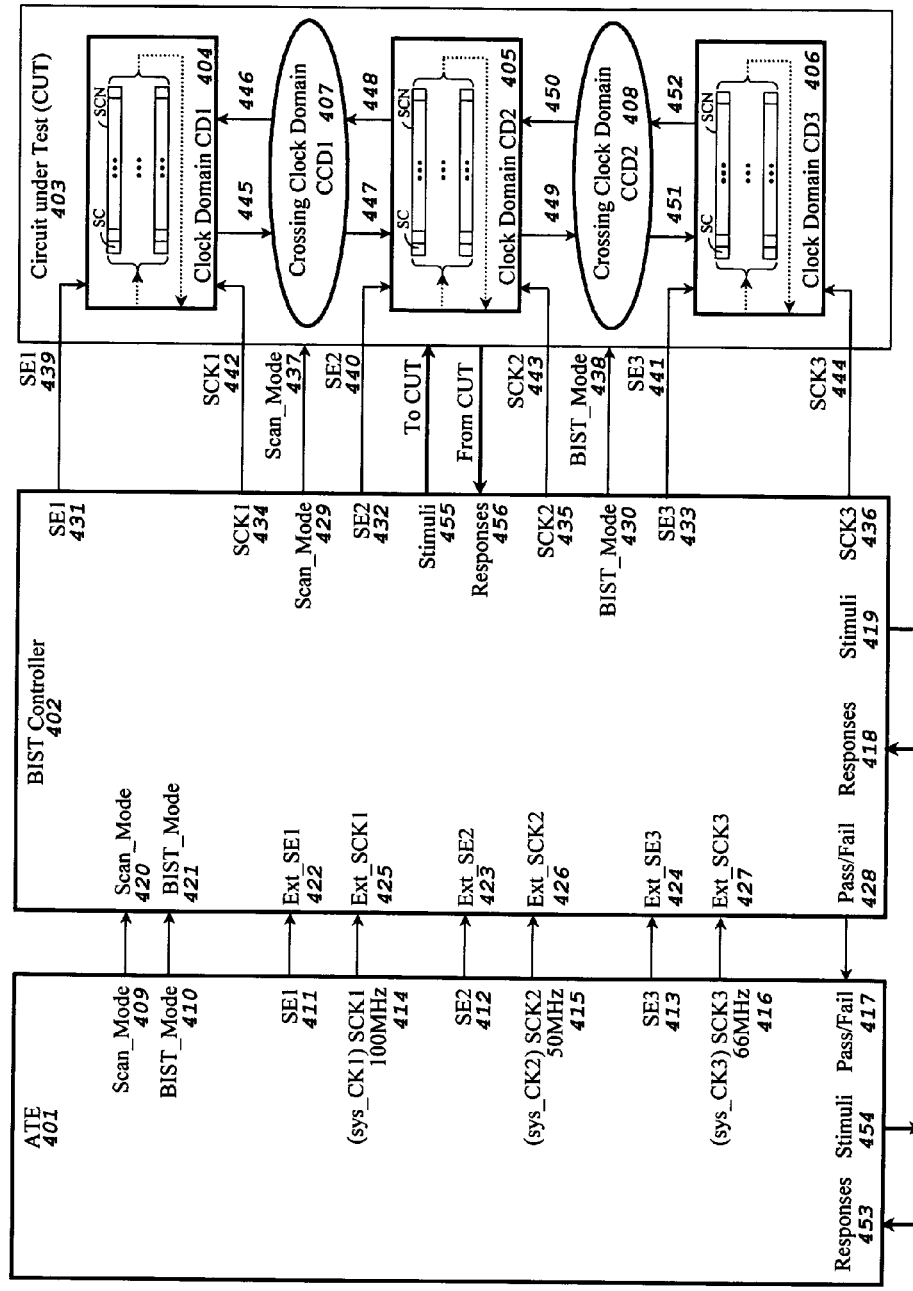
FIG. 4 shows a prior-art example full-scan or partial-scan integrated circuit with three clock domains and three system clocks, where a conventional BIST (Built-In Self-Test) controller, controlled directly by an ATE (automatic test equipment), is used to detect or locate stuck-type or non-stuck-type faults in self-test mode.

FIG. 4 shows a prior-art example full-scan or partial-scan integrated circuit or circuit under test (CUT) 403 with three clock domains, CD1 404 to CD3 406, and three system clocks, sys_CK1 414 to sys_CK3 416, where a conventional BIST (Built-In Self-Test) controller 402, connected directly to an ATE (automatic test equipment) 401, is used to detect or locate stuck-type or non-stuck-type faults in self-test mode.

The conventional BIST controller 402 usually contains PRPGs (pseudo-random pattern generators) to generate pseudo-random patterns as test stimuli 455 for the CUT 403 to detect or locate stuck-type or non-stuck-type faults. Test responses 456 from the CUT 403 are compressed by MISRs (multiple-input signature registers) into test signatures. The signatures are then compared with corresponding expected values, and a Pass/Fail signal 428 will be set to indicate if the CUT 403 is faulty or not.

Figure 5:
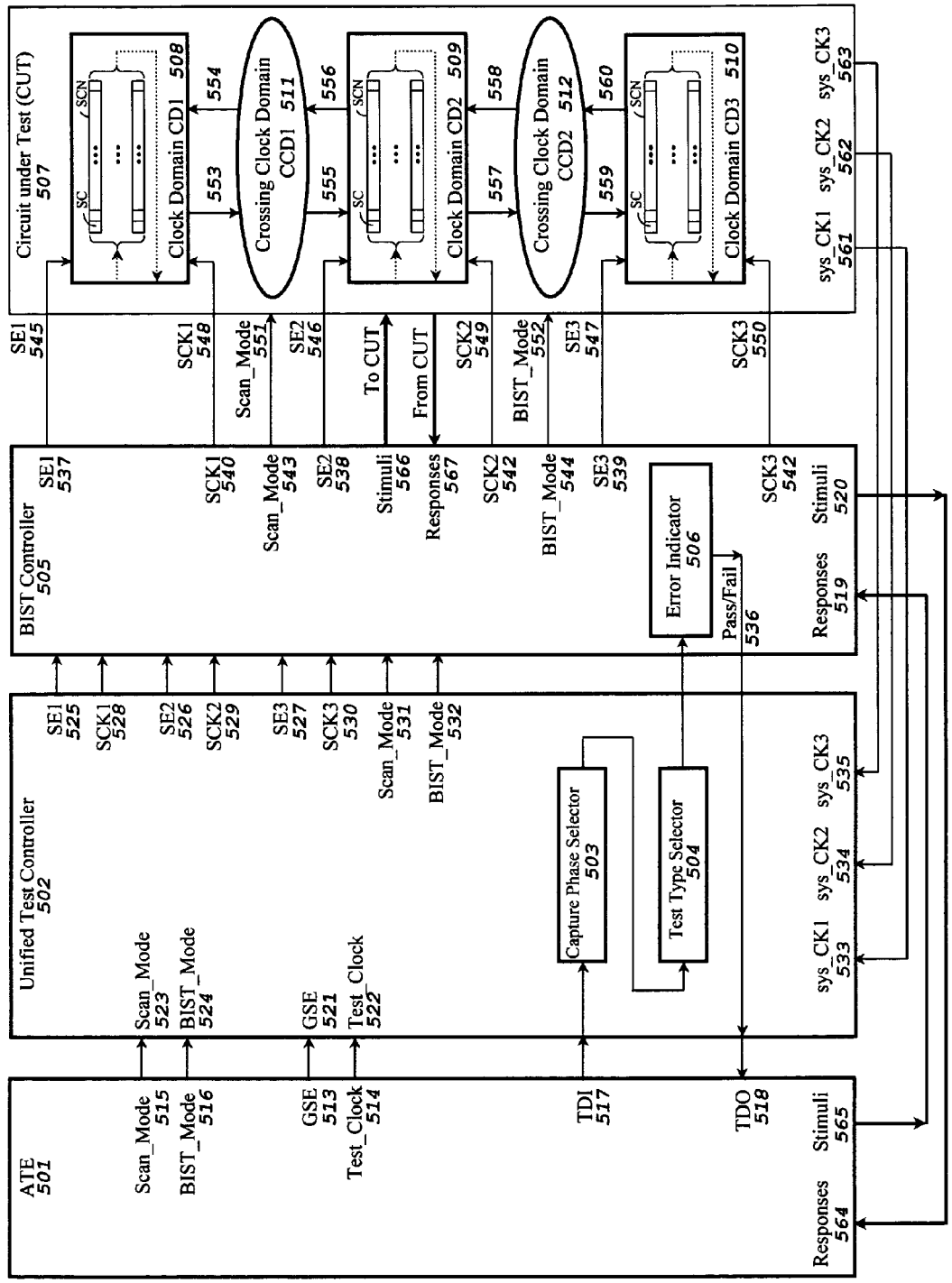
FIG. 5 shows an example full-scan or partial-scan integrated circuit with three clock domains and three system clocks, where a unified test controller, in accordance with the present invention and controlled directly by an ATE (automatic test equipment), is used to detect or locate stuck-type or non-stuck-type faults at reduced-speed or at-speed in self-test mode.

FIG. 5 shows an example full-scan or partial-scan integrated circuit or circuit under test (CUT) 507 with three clock domains, CD1 508 to CD3 510, and three system clocks, sys_CK1 561 to sys_CK3 563, where a unified test controller 502, in accordance with the present invention and controlled directly by an ATE 501, is used to detect or locate stuck-type or non-stuck-type faults at reduced-speed or at-speed in self-test mode.

The ATE 501 provides a scan mode signal Scan_Mode 515, a BIST (Built-In Self-Test) mode signal BIST_Mode 516, a global scan enable signal GSE 513, and a test clock Test_Clock 514 to the unified test controller 502.

The unified test controller 502 passes the scan mode signal and the BIST mode signal from the ATE 501 to the CUT 507. In addition, it generates three scan enable (SE) signals, SE1 525 to SE3 527, and three scan clocks (SCKs), SCK1 528 to SCK3 530, for the three clock domains, CD1 508 to CD3 510, respectively. These scan enable (SE) signals and scan clocks (SCKs) are generated in response to the global scan enable signal GSE 521, the test clock Test_Clock 522, and system clocks, sys_CK1 533 to sys_CK3 535. The unified test controller 502 also has two shift registers: a capture phase selector 503 and a test type selector 504. These two shift registers are chained together and can be accessed from the ATE 501 through the TDI 517 and TDO 518 ports. Depending on the value of the capture phase selector 503, the capture order determined by the phases of the scan clocks (SCKs), SCK1 528 to SCK3 530, can be selected. Depending on the value of the test type selector 504, waveforms for scan clocks (SCKs), SCK1 528 to SCK3 530, can be generated to detect or locate either stuck-type or non-stuck-type faults.

The new BIST controller 505 now contains PRPGs (pseudo-random pattern generators) to generate pseudo-random patterns as test stimuli 566 for the CUT 507 to detect or locate stuck-type or non-stuck-type faults. Test responses 567 from the CUT 507 are compressed by MISRs (multiple-input signature registers) into test signatures. The signatures are then compared with corresponding expected values, and a Pass/Fail signal 536 will be set to indicate if the CUT 507 is faulty or not. This Pass/Fail value is stored in the error indicator 506, which is also chained together with the capture phase selector 503 and the test type selector 504. This means that proper set-up values can be shifted into the capture phase selector 503 and the test type selector 504 while the Pass/Fail signal value can be shifted out for observation through the TDI 517 and TDO 518 ports.

With the use of the unified test controller 502, the function of the ATE 501 and the BIST controller 505 can be dramatically simplified since scan test control signals, including scan enable (SE) signals and scan clocks (SCKs) for all clock domains, can now be generated by the unified test controller 502. In addition, such a unified test controller is common to both self-test and scan-test. This makes it possible to a low-cost DFT (design-for-test) tester or a low-cost DFT debugger to test or diagnose a scan-based integrated circuit with large size and high complexity. The DFT design flow will also be simplified.

FIG. 6 shows an example full-scan or partial-scan integrated circuit or circuit under test (CUT) 609 with three clock domains, CD1 610 to CD3 612, and three system clocks sys_CK1 682 to sys_CK3 684, where a unified test controller 603, in accordance with the present invention and controlled by an ATE (automatic test equipment) 601 through a TAP (Test access port) controller 602, is used to detect or locate stuck-type or non-stuck-type faults at reduced-speed or at-speed in self-test mode.

The ATE 601 provides an external test clock Ext_Test_Clock 615 as well as a standard five-pin TAP interface, TMS (Test mode selection) 617, TDI (Test data in) 618, TDO (Test data out), 619, TCK (Test clock) 616, and optionally TRSTB (Test reset) 620, to the unified test controller 603.

The TAP controller 602 generates a scan mode signal Scan_Mode 634 and a BIST (Built-In Self-Test) mode signal BIST_Mode 635 for the CUT 609 from the values shifted-in from the ATE 601 through the TDI 625 port. In addition, it generates Shift_DR 628, Capture_DR 630, Update_DR 629, and Clock_DR 631 signals for the unified test controller 603. These signals are used to generate an internal global scan enable (GSE) signal for the unified test controller 603.

The unified test controller 603 generates three scan enable (SE) signals, SE1 646 to SE3 648, and three scan clocks (SCKs), SCK1 649 to SCK3 651, for the three clock domains, CD1 610 to CD3 612, respectively. These scan enable (SE) signals and scan clocks (SCKs) are generated in response to a global scan enable (GSE) signal, the TCK clock 642, the external test clock Ext_Test_Clock 643, and system clocks, sys_CK1 654 to sys_CK3 656. The unified test controller 603 also has three shift registers: a clock type selector 604, a capture phase selector 605, and a test type selector 606. These three shift registers are chained together and can be accessed from the TAP controller 602 through the TDI 636 and TDO 637 ports. Depending on the value of the clock type selector 604, either the TCK clock 642 or the external test clock Ext_Test_Clock 643 can be selected as an internal test clock. Depending on the value of the capture phase selector 605, the capture order determined by the phases of the scan clocks (SCKs), SCK1 649 to SCK3 651, can be selected. Depending on the value of the test type selector 606, waveforms for scan clocks (SCKs), SCK1 649 to SCK3 651, can be generated to detect or locate either stuck-type or non-stuck-type faults.

The new BIST controller 607 now contains PRPGs (pseudo-random pattern generators) to generate pseudo-random patterns as test stimuli 687 for the CUT 609 to detect or locate stuck-type or non-stuck-type faults. Test responses 688 from the CUT 609 are compressed by MISRs (multiple-input signature registers) into test signatures. The signatures are then compared with corresponding expected values, and a Pass/Fail signal 665 will be set to indicate if the CUT 609 is faulty or not. This Pass/Fail value is stored in the error indicator 608, which is also chained together with the clock type selector 604, the capture phase selector 605, and the test type selector 606. This means that proper set-up values can be shifted into the clock type selector 604, the capture phase selector 605, and the test type selector 606 while the Pass/Fail signal value can be shifted out for observation through the TDI 636 and TDO 637 ports.

With the use of the unified test controller 603 together with the TAP controller 602, the function of the ATE 601 and the BIST controller 607 can be further simplified since scan test control signals, including scan enable (SE) signals and scan clocks (SCKs) for all clock domains, can now be generated by the unified test controller 603 instead of the ATE 601 and the BIST controller 607. The ATE 601 only needs to provide some initial control values and a TCK clock through a standard TAP interface. This makes it possible to use a low-cost DFT (design-for-test) tester or a low-cost DFT debugger to test or diagnose a scan-based integrated circuit with large size and high complexity. The DFT design flow will also be simplified.

FIG. 7 shows a block diagram 700 of a unified test controller 701, in accordance with the present invention, consisting of a capture clock generator 703, a capture phase selector 702, a test type selector 704, and three domain clock generators, 705 to 707, each for generating the scan enable (SE) signal and the scan clock (SCK) for each of three clock domains.

The global scan enable signal GSE 708 can be provided externally from an ATE (automatic test equipment) or generated internally by a TAP (test access port) controller. It is used to define the boundary between shift and capture cycles for all clock domains.

The test clock Test_Clock 709 is provided from an ATE either as a TCK clock in a Boundary-scan design or as a direct external test clock. A clock type selector can be used to select a desired one.

The TDI (Test data in) 710 and TDO (Test data out) 711 ports are used to set proper values into the capture phase selector 702 and the test type selector 704. Three capture phase selection signals, Capture_Phase_Select1 712 to Capture_Phase_Select3 714, are generated based on the set-up values stored in the capture phase selector 702. In addition, three test type selection signals, Test_Type_Select1 721 to Test_Type_Select3 723, are generated based on the set-up values stored in the test type selector 704.

The capture clock generator 703 generates three capture clocks (CCKs), CCK1 715 to CCK3 717, in response to the global scan enable GSE 708, the test clock Test_Clock 709, and the three capture phase selection signals, Capture_Phase_Select1 712 to Capture_Phase_Select3 714. Furthermore, three domain clock generators, 705 to 707, generate scan enable (SE) signals, SE1 724 and SE3 726, as well as scan clocks (SCKs), SCK1 727 and SCK3 729, for all clock domains, in response to the capture clocks (CCKs), CCK1 715 to CCK3 717, system clocks, sys_CK1 718 to sys_CK3 720, and test type selection signals, Test_Type_Select1 721 to Test_Type_Select3 723.

Note that the function of a unified test controller is general in the sense that it can be used for both self-test and scan-test. By using a unified test controller, the DFT (design-for-test) design flow will be greatly simplified. In addition, it makes it easy to use a low-cost DFT tester, a low-cost DFT debugger, or a BIST (Built-In Self-Test) solution in testing or diagnosing a scan-based integrated circuit with large size and high complexity.

FIG. 8 shows a block diagram 800 of a global scan enable generator 801 of one embodiment of the present invention to generate a global scan enable (GSE) signal. The global scan enable generator 801 contains one D flip-flop 802 with both asynchronous set and reset pins. The Shift_DR signal 803 and the Update_DR signal 804 are used to control the asynchronous set pin and the asynchronous set pin of the D flip-flop 802, respectively. The output of the D flip-flop 802 becomes the global scan enable GSE 805. Note that both the Shift_DR signal 803 and the Update_DR signal 804 are from a TAP (Test access port) controller that is constructed according to a selected Boundary-scan Standard such as the IEEE 1149.1 Std.

FIG. 9 shows a block diagram 900 of a test clock generator 901 and a clock type selector 902 of one embodiment of the present invention. The clock type selector 902 is a shift register, and proper set-up values can be shifted into it through the TDI (Test data in) 905 and TDO (Test data out) 906 ports. The set-up values are used to generate the clock type selection signal Clock_Type_Select 907. If Clock_Type_Select 907 is logic value "0", the test clock generator 901 will select the external test clock Ext_Test_Clock 904 as the test clock Test_Clock 908. If Clock_Type_Select 907 is logic value "1", the test clock generator 901 will select the TCK clock 903 as the test clock Test_Clock 908. Note that the test clock Test_Clock 908 is selectively synchronized to either the TCK clock 903 or the external test clock Ext_Test_Clock 904.

FIG. 10A shows the waveforms 1000 of three capture clocks (CCKs), CCK1 1006 to CCK3 1008, as well as a global scan enable signal GSE 1003 and a free-running test clock Test_Clock 1001. The test clock serves as a reference clock and the global scan enable (GSE) signal serves for timing controls. In response to the test clock Test_Clock 1001 and the global scan enable signal GSE 1003, the capture clock generator 703 shown in FIG. 7 generates the waveforms, 1015 to 1017, for the three capture clocks (CCKs), CCK1 1006 to CCK3 1008, respectively. Note that non-overlapping capture clocks (CCKs), CCK1 1006 to CCK3 1008, are generated for both shift (GSE=1) and capture (GSE=0) cycles. These capture clocks (CCKs) will then be used to guide the generation of clock-domain based scan clocks (SCKs) by the domain clock generators, 705 to 707, shown in FIG. 7.

FIG. 10B shows the waveforms 1050 of three capture clocks (CCKs), CCK1 1056 to CCK3 1058, as well as a global scan enable signal GSE 1053 and a free-running test clock Test_Clock 1051. The test clock serves as a reference clock and the global scan enable (GSE) signal serves for timing controls. In response to the test clock Test_Clock 1051 and the global scan enable signal GSE 1053, the capture clock generator 703 shown in FIG. 7 generates the waveforms, 1065 to 1067, for the three capture clocks (CCKs), CCK1 1056 to CCK3 1058, respectively. Note that capture clocks (CCKs), CCK1 1056 to CCK3 1058, are generated as overlapping waveforms for the shift cycle (GSE=1) but as non-overlapping waveforms for the capture (GSE=0) cycle. These capture clocks (CCKs) will then be used to guide the generation of clock-domain based scan clocks (SCKs) by the domain clock generators, 705 to 707, shown in FIG. 7.

FIG. 11A shows the waveforms 1100 of three scan clocks (SCKs), SCK1 1113 to SCK3 1115, as well as various scan enable (SE) signals 1110 including one global scan enable signal GSE and three scan enable (SE) signals, SE1 to SE3, for three clock domains. Waveforms for the three corresponding capture clocks (CCKs), CCK1 1101 to CCK3 1103, are also shown.

The waveforms of the three scan clocks (SCKs), SCK1 1113 to SCK3 1115, are generated in response to the global scan enable signal GSE 1110 and the capture clocks (CCKs), CCK1 1101 to CCK3 1103, and they are used to detect or locate stuck-type faults in self-test or scan-test mode, in accordance with the present invention. In this example, the waveforms of the three scan enable (SE) signals, SE1 to SE3, are the same as that of the global scan enable signal GSE 1110.

Note that non-overlapping scan clocks (SCKs), SCK1 1113 to SCK3 1115, are generated for both shift (GSE, SE1, SE2, SE3=1) and capture (GSE, SE1, SE2, SE3=0) cycles. As illustrated by pulses, 1116 to 1118, this clocking scheme can reduce both peak power consumption and average power dissipation in the shift cycle. In the capture cycle, clock-domain based capture pulses, 1119 to 1121, are applied to detect or locate all stuck-at faults, bridging faults, and IDDQ (IDD quiescent current) faults within all three clock domains, such as CD1 206 to CD3 208 shown in FIG. 2, and within crossing clock-domain logic blocks, such as CCD1 209 and CCD2 210 shown in FIG. 2.

FIG. 11B shows the waveforms 1150 of three scan clocks (SCKs), SCK1 1163 to SCK3 1165, as well as various scan enable signals 1160 including one global scan enable signal GSE and three scan enable (SE) signals, SE1 to SE3, for three clock domains. Waveforms for the three corresponding capture clocks (CCKs), CCK1 1151 to CCK3 1153, are also shown.

The waveforms of the three scan clocks (SCKs), SCK1 1163 to SCK3 1165, are generated in response to the global scan enable signal GSE 1160 and the capture clocks (CCKs), CCK1 1151 to CCK3 1153, and they are used to detect or locate stuck-type faults in self-test or scan-test mode, in accordance with the present invention. In this example, the waveforms of the three scan enable (SE) signals, SE1 to SE3, are the same as that of the global scan enable signal GSE 1160.

Note that scan clocks (SCKs), SCK1 1163 to SCK3 1165, are generated as overlapping waveforms for the shift cycle (GSE, SE1, SE2, SE3=1) but as non-overlapping waveforms for the capture cycle (GSE, SE1, SE2, SE3=0). As illustrated by pulses, 1166 to 1168, this clocking scheme can reduce the time needed for the shift cycle. In the capture cycle, clock-domain based capture pulses, 1169 to 1171, are applied to detect or locate all stuck-at faults, bridging faults, and IDDQ (IDD quiescent current) faults within all three clock domains, such as CD1 206 to CD3 208 shown in FIG. 2, and within crossing clock-domain logic blocks, such as CCD1 209 and CCD2 210 shown in FIG. 2.

FIG. 12A shows the waveforms 1200 of three scan clocks (SCKs), SCK1 1213 to SCK3 1215, as well as various scan enable (SE) signals 1210 including one global scan enable signal GSE and three scan enable (SE) signals, SE1 to SE3, for three clock domains. Waveforms for the three corresponding capture clocks (CCKs), CCK1 1201 to CCK3 1203, are also shown.

The waveforms of the three scan clocks (SCKs), SCK1 1213 to SCK3 1215, are generated in response to the global scan enable signal GSE 1210 and the capture clocks (CCKs), CCK1 1201 to CCK3 1203, and they are used to detect or locate non-stuck-type faults at-speed with the capture launch (double capture) scheme in self-test or scan-test mode, in accordance with the present invention. In this example, the waveforms of the three scan enable (SE) signals, SE1 to SE3, are the same as that of the global scan enable signal GSE 1210.

Note that non-overlapping scan clocks (SCKs), SCK1 1213 to SCK3 1215, are generated for both shift (GSE, SE1, SE2, SE3=1) and capture (GSE, SE1, SE2, SE3=0) cycles. As illustrated by pulses, 1216 to 1218, this clocking scheme can reduce both peak power consumption and average power dissipation in the shift cycle. In the capture cycle, clock-domain based at-speed double-capture pulses, <1219, 1220>, <1221, 1222>, and <1223, 1224>, are applied to detect or locate all transition and path delay faults at-speed within all three clock domains, such as CD1 206 to CD3 208 shown in FIG. 2.

FIG. 12B shows the waveforms 1230 of three scan clocks (SCKs), SCK1 1243 to SCK3 1245, as well as various scan enable signals 1240 including one global scan enable signal GSE and three scan enable (SE) signals, SE1 to SE3, for three clock domains. Waveforms for the three corresponding capture clocks (CCKs), CCK1 1231 to CCK3 1233, are also shown.

The waveforms of the three scan clocks (SCKs), SCK1 1243 to SCK3 1245, are generated in response to the global scan enable signal GSE 1240 and the capture clocks (CCKs), CCK1 1231 to CCK3 1233, and they are used to detect or locate non-stuck-type faults at-speed with the capture launch (double capture) scheme in self-test or scan-test mode, in accordance with the present invention. In this example, the waveforms of the three scan enable (SE) signals, SE1 to SE3, are the same as that of the global scan enable signal GSE 1240.

Note that scan clocks (SCKs), SCK1 1243 to SCK3 1245, are generated as overlapping waveforms for the shift cycle (GSE, SE1, SE2, SE3=1) but as non-overlapping waveforms for the capture cycle (GSE, SE1, SE2, SE3=0). As illustrated by pulses, 1246 to 1248, this clocking scheme can reduce the time needed for the shift cycle. In the capture cycle, clock-domain based at-speed double-capture pulses, <1249, 1250>, <1251, 1252>, and <1253, 1254>, are applied to detect or locate all transition and path delay faults at-speed within all three clock domains, such as CD1 206 to CD3 208 shown in FIG. 2.

FIG. 12C shows the waveforms 1260 of three scan clocks (SCKs), SCK1 1273 to SCK3 1275, as well as various scan enable signals 1270 including one global scan enable signal GSE and three scan enable (SE) signals, SE1 to SE3, for three clock domains. Waveforms for the three corresponding capture clocks (CCKs), CCK1 1261 to CCK3 1263, are also shown.

The waveforms of the three scan clocks (SCKs), SCK1 1273 to SCK3 1275, are generated in response to the global scan enable signal GSE 1270 and the capture clocks (CCKs), CCK1 1261 to CCK3 1263, and they are used to detect or locate non-stuck-type faults, including 2-cycle delay faults, at-speed with the capture launch (double capture) scheme in self-test or scan-test mode, in accordance with the present invention. In this example, the waveforms of the three scan enable (SE) signals, SE1 to SE3, are the same as that of the global scan enable signal GSE 1270.

Note that scan clocks (SCKs), SCK1 1273 to SCK3 1275, are generated as overlapping waveforms for the shift cycle (GSE, SE1, SE2, SE3=1) but as non-overlapping waveforms for the capture cycle (GSE, SE1, SE2, SE3=0). As illustrated by pulses, 1276 to 1278, this clocking scheme can reduce the time needed for the shift cycle. In the capture cycle, at-speed double-capture pulses, <1281, 1282> and <1283, 1284>, are applied to detect or locate all transition and path delay faults at-speed within the corresponding clock domains, such as CD2 207 and CD3 208 shown in FIG. 2. On the other hand, half-reduced-speed double-capture pulses, <1279, 1280>, are applied to detect or locate all 2-cycle delay faults at-speed in the corresponding clock domain, such as CD1 206 shown in FIG. 2.

FIG. 13A shows the waveforms 1300 of three scan clocks (SCKs), SCK1 1319 to SCK3 1321, as well as three scan enable (SE) signals, SE1 1310 to SE3 1312, for three clock domains. Waveforms for the three corresponding capture clocks (CCKs), CCK1 1301 to CCK3 1303, are also shown.

The waveforms of the three scan clocks (SCKs), CK1 1319 to SCK3 1321, are generated in response to a global scan enable (GSE) signal and the capture clocks (CCKs), CCK1 1301 to CCK3 1303, and they are used to detect or locate non-stuck-type faults at-speed with the last-shift launch scheme in self-test or scan-test mode, in accordance with the present invention. In this example, the three scan enable (SE) signals, SE1 1310 to SE3 1312, have different waveforms.

Note that non-overlapping scan clocks (SCKs), SCK1 1319 to SCK3 1321, are generated for both shift (GSE, SE1, SE2, SE3=1) and capture (GSE, SE1, SE2, SE3=0) cycles. As illustrated by pulses, 1322 to 1324, this clocking scheme can reduce both peak power consumption and average power dissipation in the shift cycle. In the capture cycle, clock-domain based at-speed last-shift launch pulses, 1326, 1328, and 1330, are applied to detect or locate all transition and path delay faults at-speed within all three clock domains, such as CD1 206 to CD3 208 shown in FIG. 2.

FIG. 13B shows the waveforms 1335 of three scan clocks (SCKs), SCK1 1354 to SCK3 1356, as well as three scan enable (SE) signals, SE1 1345 to SE3 1347, for three clock domains. Waveforms for the three corresponding capture clocks (CCKs), CCK1 1336 to CCK3 1338, are also shown.

The waveforms of the three scan clocks (SCKs), SCK1 1354 to SCK3 1356, are generated in response to a global scan enable (GSE) signal and the capture clocks (CCKs), CCK1 1336 to CCK3 1338, and they are used to detect or locate non-stuck-type faults at-speed with the last-shift launch scheme in self-test or scan-test mode, in accordance with the present invention. In this example, the three scan enable (SE) signals, SE1 1345 to SE3 1347, have different waveforms.

Note that scan clocks (SCKs), SCK1 1354 to SCK3 1356, are generated as overlapping waveforms for the shift cycle (GSE, SE1, SE2, SE3=1) but as non-overlapping waveforms for the capture cycle (GSE, SE1, SE2, SE3=0). As illustrated by pulses, 1357 to 1359, this clocking scheme can reduce the time needed for the shift cycle. In the capture cycle, clock-domain based at-speed last-shift launch pulses, 1361, 1363, and 1365, are applied to detect or locate all transition and path delay faults at-speed within all three clock domains, such as CD1 206 to CD3 208 shown in FIG. 2.

FIG. 13C shows the waveforms 1366 of three scan clocks (SCKs), SCK1 1385 to SCK3 1387, as well as three scan enable (SE) signals, SE1 1376 to SE3 1378, for three clock domains. Waveforms for the three corresponding capture clocks (CCKs), CCK1 1367 to CCK3 1369, are also shown.

The waveforms of the three scan clocks (SCKs), SCK1 1385 to SCK3 1387, are generated in response to a global scan enable (GSE) signal and the capture clocks (CCKs), CCK1 1367 to CCK3 1369, and they are used to detect or locate non-stuck-type faults, including 2-cycle delay faults, at-speed with the last-shift launch scheme in self-test or scan-test mode, in accordance with the present invention. In this example, the three scan enable (SE) signals, SE1 1376 to SE3 1378, have different waveforms.

Note that scan clocks (SCKs), SCK1 1385 to SCK3 1387, are generated as overlapping waveforms for the shift cycle (GSE, SE, SE2, SE3=1) but as non-overlapping waveforms for the capture cycle (GSE, SE, SE2, SE3=0). As illustrated by pulses, 1388 to 1390, this clocking scheme can reduce the time needed for the shift cycle. In the capture cycle, at-speed last-shift launch pulses 1394 and 1396 are applied to detect or locate all transition and path delay faults at-speed within the corresponding clock domains, such as CD2 207 and CD3 208 shown in FIG. 2. On the other hand, half-reduced-speed last-shift launch pulse 1392 is applied to detect or locate all 2-cycle delay faults at-speed in the corresponding clock domain, such as CD1 206 shown in FIG. 2.

FIG. 14A shows a block diagram 1400a of a unified test controller 1401a connected to a BIST (Built-In Self-Test) controller with three pairs of PRPGs (pseudo-random pattern generators) and MISRs (multiple-input signature registers), <1408a, 1417a>, <1409a, 1418a>, and <1410a, 1419a>, in accordance with the present invention, which are used to test or diagnose a scan-based integrated circuit or circuit under test (CUT) 1402a with three clock domains, CD1 1403a to CD3 1405a, in self-test mode.

Three PRPGs, 1408a to 1410a, are used to generate pseudo-random patterns for the three clock domains, CD1 1403a to CD3 1405a, one PRPG for each clock domain. Phase shifters, 1411a to 1413a, are used to break the dependency between different outputs of the PRPGs. The bit streams coming from the phase shifters become test stimuli, 1446a to 1448a.

Three MISRs, 1417a to 1419a, are used to generate signatures for the three clock domains, CD1 1403a to CD3 1405a, one MISR for each clock domain. Space compactors, 1414a to 1416a, are used to reduce the number of bit streams in test responses, 1457a to 1459a. Space compactors are optional and are only used when the overhead of a MISR becomes a concern. The outputs of the space compactors are compressed by MISRs, 1417a to 1419a. The contents of the MISRs, 1417a to 1419a, after all test stimuli are applied become signatures, 1463a to 1465a, respectively.

The signatures are then compared by comparators, 1420a to 1422a, with corresponding expected values. The error indicator 1423a is used to combine the individual pass/fail signals, 1466a to 1468a, to a global pass/fail signal 1469a.

The unified test controller 1401a controls the whole BIST test process by providing scan enable (SE) signals, SE1 1427a to SE3 1429a, and scan clocks (SCKs), SCK1 1430a to SCK3 1432a. Some additional data and control signals 1433a are also provided to conduct other control tasks.

All storage cells in PRPGs, 1408a to 1410a, and MISRs, 1417a to 1419a, can be connected into a scan chain from which predetermined patterns can be shifted in for reseeding and computed signatures can be shifted out for analysis. This configuration helps in increasing fault coverage and in facilitating fault diagnosis.

Generally, a plurality of PRPG-MISR pairs can be used in a flexible manner. In addition, any PRPG-MISR pair can be further split into two or more smaller PRPG-MISR pairs. Furthermore, two or more PRPG-MISR pairs can be further merged into a larger PRPG-MISR pair.

FIG. 14B shows a block diagram 1400b of a unified test controller 1401b connected to a BIST (Built-In Self-Test) controller with two pairs of PRPGs (pseudo-random pattern generators) and MISRs (multiple-input signature registers), <1408b, 1416b> and <1409b, 1417b>, in accordance with the present invention, which are used to test or diagnose a scan-based integrated circuit or circuit under test (CUT) 1402b with three clock domains, CD1 1403b to CD3 1405b, in self-test mode.

Two PRPGs, 1408b and 1409b, are used to generate pseudo-random patterns for the three clock domains, CD1 1403b to CD3 1405b. Two clock domains, CD1 1403b and CD2, 1404b, share the same PRPG 1408b. This will reduce the PRPG overhead. Phase shifters, 1410b to 1412b, are used to break the dependency between different outputs of the PRPGs. The bit streams coming from the phase shifters become test stimuli, 1444b to 1446b.

Two MISRs, 1416*b* to 1417*b*, are used to generate signatures for the three clock domains, CD1 1403*b* to CD3 1405*b*. Two clock domains, CD1 1403*b* and CD2 1404*b*, share the same MISR 1416*b*. This will reduce the MISR overhead. Space compactors, 1413*b* to 1415*b*, are used to reduce the number of bit streams in test responses, 1455*b* to 1457*b*. Space compactors are optional and are only used when the overhead of a MISR becomes a concern. The outputs of the space compactors are compressed by the MISRs, 1416*b* and 1417*b*. The contents of the MISRs, 1416*b* and 1417*b*, after all test stimuli are applied become signatures, 1461*b* to 1463*b*, respectively.

The signatures are then compared by comparators, 1418*b* to 1420*b*, with corresponding expected values. The error indicator 1421*b* is used to combine the individual pass/fail signals, 1464*b* to 1466*b*, into a global pass/fail signal 1467*b*.

The unified test controller 1401*b* controls the whole BIST test process by providing scan enable (SE) signals, SE1 1425*b* to SE3 1427*b*, and scan clocks (SCKs), SCK1 1428*b* to SCK3 1430*b*. Some additional data and control signals 1431*b* are also provided to conduct other control tasks.

All storage cells in PRPGs, 1408*b* and 1409*b*, as well as MISRs, 1416*b* and 1417*b*, can be connected into a scan chain from which predetermined patterns can be shifted in for reseeding and computed signatures can be shifted out for analysis. This configuration helps in increasing fault coverage and in facilitating fault diagnosis.

FIG. 14C shows a block diagram 1400*c* of a unified test controller 1401*c* connected to a BIST (Built-In Self-Test) controller with one pair of PRPG (pseudo-random pattern generator) and MISR (multiple-input signature register) <1408*c*, 1415*c*> in accordance with the present invention, which are used to test or diagnose a scan-based integrated circuit or circuit under test (CUT) 1402*c* with three clock domains, CD1 1403*c* to CD3 1405*c*, in self-test mode.

One PRPG 1408*c* is used to generate pseudo-random patterns for the three clock domains, CD1 1403*c* to CD3 1405*c*. Three clock domains, CD1 1403*c* to CD3 1405*c*, share the same PRPG 1408*c*. This will further reduce the PRPG overhead. Phase shifters, 1409*c* to 1411*c*, are used to break the dependency between different outputs of the PRPGs. The bit streams coming from the phase shifters become test stimuli, 1442*c* to 1444*c*.

One MISR 1415*c* is used to generate signatures for the three clock domains, CD1 1403*c* to CD3 1405*c*. Three clock domains, CD1 1403*c* to CD3 1405*c*, share the same MISR 1415*c*. This will further reduce the MISR overhead. Space compactors, 1412*c* to 1414*c*, are used to reduce the number of bit streams in test responses, 1453*c* to 1455*c*. Space compactors are optional and are only used when the overhead of a MISR becomes a concern. The outputs of the space compactors are compressed by the MISR 1415*c*. The content of the MISR 1415*c* after all test stimuli are applied becomes the signatures, 1459*c* to 1461*c*.

The signature is then compared by the comparators, 1416*c* to 1418*c*, with corresponding expected values. The error indicator 1419*c* is used to combine the individual pass/fail signals, 1462*c* to 1464*c*, to a global pass/fail signal 1465*c*.

The unified test controller 1401*c* controls the whole BIST test process by providing scan enable (SE) signals, SE1 1423*c* to SE3 1425*c*, and scan clocks (SCKs), SCK1 1426*c* to SCK3 1428*c*. Some additional data and control signals 1429*c* are also provided to conduct other control tasks.

All storage cells in the PRPG 1408*c* and the MISR 1415*c* can be connected into a scan chain from which predetermined patterns can be shifted in for reseeding and computed signatures can be shifted out for analysis. This configuration helps in increasing fault coverage and in facilitating fault diagnosis.

FIG. 14D shows a block diagram 1400*d* of a unified test controller 1401*d* and one decompressor-compressor pair <1408*d*, 1409*d*>, in accordance with the present invention, which are used to test or diagnose a scan-based integrated circuit or circuit under test (CUT) 1402*d* with three clock domains CD1, 1403*d* to CD3 1405*d*, in scan-test mode.

The decompressor 1408*d* can be a reconfigurable PRPG (pseudo-random pattern generator) or a broadcaster. It serves the purpose of expanding compressed test stimulus data applied from external pins to test the internal circuit core 1402*d*. This will reduce the test data storage requirements and simplify the external test interface, which results in lower test costs.

The compressor 1409*d* can be MISR (multiple-input signature register) or a compactor. It serves the purpose of compressing test responses from the internal circuit core 1402*d* as compressed test response data for external observation or comparison at the ATE (automatic test equipment) 1413*d*. This will reduce the test data storage requirements and simplify the external test interface, which results in lower test costs.

The unified test controller 1401*d* controls the whole test process by providing scan enable (SE) signals, SE1 1414*d* to SE3 1416*d*, and scan clocks (SCKs), SCK1 1417*d* to SCK3 1419*d*. Some additional data and control signals 1420*d* are also provided to conduct other control tasks.

Generally, a plurality of decompressor-compressor pairs can be used in a flexible manner. In addition, any decompressor-compressor pair can be further split into two or more smaller decompressor-compressor pairs. Furthermore, two or more decompressor-compressor pairs can be further merged into a larger decompressor-compressor pair.

FIG. 15 shows the flow diagram 1500 of a computer-readable program in a computer-readable memory, in accordance with the present invention, to cause a computer system to perform a method for synthesizing a unified test controller for testing or diagnosing a plurality of clock domains in a scan-based integrated circuit in self-test or scan-test mode.

The computer-readable program accepts the user-supplied HDL (hardware description language) code at RTL (register-transfer level) or netlist at gate-level 1502 together with the user-supplied test constraint files 1501 as well as the chosen foundry library 1503. The test constraint files 1501 contain all set-up information and scripts required for compilation 1504, unified test controller synthesis 1506, and unified test controller integration 1507, so that the computer-readable program can produce the final synthesized HDL code or netlist 1509 with the unified test controller. The HDL test benches and ATE (automatic test equipment) test programs 1508 are also generated in order to verify the correctness of the unified test controller in the scan-based integrated circuit in self-test or scan-test mode. All results and errors are saved in the report files 1510.

FIG. 16 shows an electronic design automation system 1600, which includes a processor 1602, a bus 1605 coupled to the processor, a computer-readable memory 1601 coupled to the bus, an input device 1603, and an output device 1604. The computer-readable memory 1601 contains a computer-readable program, in accordance with the present invention and described in FIG. 15, to cause the electronic design automation system 1600 to perform a method for synthesizing a unified test controller for testing or diagnosing a plurality of clock domains in a scan-based integrated circuit in self-test or scan-test mode.

The processor 1602 may represent a central processing unit of a personal computer, workstation, mainframe computer or other suitable digital processing device. The memory 1601 can be an electronic memory or a magnetic or optical disk-based memory, or various combinations thereof. A designer interacts with the broadcast scan test design software run by the processor 1602 to provide appropriate inputs via an input device 1603, which may be a keyboard, disk drive or other suitable source of design information. The processor 1602 provides outputs to the designer via an output device 1604, which may be a display, a printer, a disk drive or various combinations of these and other elements.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A unified test controller for testing or diagnosing a plurality of clock domains in a scan-based integrated circuit in selected self-test or scan-test mode, the unified test controller having a global scan enable (GSE) signal and a test clock, and each domain controlled by one system clock; said unified test controller comprising:
    (a) a capture clock generator for generating an ordered sequence of capture clocks (CCKs) in response to said global scan enable (GSE) signal and said test clock; and
    (b) a plurality of domain clock generators, each domain clock generator for generating a scan enable (SE) signal and a scan clock (SCK) for controlling one said clock domain, in response to said global scan enable (GSE) signal, said system clock, and a corresponding one of said capture clocks (CCKs).

2. The unified test controller of claim 1, further including a capture phase selector for storing a selected order of capture phases for allowing reordering of said ordered sequence of capture clocks; wherein each said selected capture phase is used to control said capture clock generator for generating one said capture clock (CCK).

3. The unified test controller of claim 2, wherein said capture phase selector is a shift register.

4. The unified test controller of claim 1, further including a test type selector for storing a plurality of selected test types for allowing at-speed or reduced-speed testing in selected clock domains; wherein each said selected test type is used to control one said domain clock generator for generating one said scan enable (SE) signal and one said scan clock (SCK).

5. The unified test controller of claim 4, wherein said test type selector is a shift register.

6. The unified test controller of claim 4, wherein said selected test type is selectively a stuck-type or a non-stuck-type; wherein said stuck-type further includes tests for stuck-at faults, bridging faults, and IDDQ (IDD quiescent current) faults; and wherein said non-stuck-type further includes tests for transition faults using last-shift launch, transition faults using capture launch, path-delay faults using last-shift launch, path-delay faults using capture launch, multiple-cycle delay faults using last-shift launch, and multiple-cycle delay faults using capture launch.

7. The unified test controller of claim 1, wherein said global scan enable (GSE) signal can be selectively generated within said scan-based integrated circuit or controlled externally.

8. The unified test controller of claim 1, wherein said test clock can be selectively generated within said scan-based integrated circuit or controlled externally.

9. The unified test controller of claim 1, further including a TAP (Test access port) controller in said selected self-test mode or said selected scan-test mode; wherein said TAP controller is constructed according to a selected Boundary-scan Standard which includes a test access port (TAP) comprising TDI (Test data in), TDO (Test data out), TCK (Test clock), TMS (Test mode select), and selectively TRSTB (Test reset).

10. The unified test controller of claim 9, wherein said global scan enable (GSE) signal is further generated by a global scan enable generator; wherein said global scan enable generator further comprises using Shift_DR, Capture_DR, and Update_DR, embedded in said TAP controller, to generate said global scan enable (GSE) signal.

11. The unified test controller of claim 9, wherein said test clock is further generated by a test clock generator having a selected clock type and a selected external test clock; wherein said test clock generator selectively selects said selected external test clock as said test clock, when said selected clock type is set to logic value '0', or selects said TCK as said test clock, when said selected clock type is set to logic value '1'.

12. The unified test controller of claim 11, wherein said selected clock type is further stored in a clock type selector for testing or diagnosing said scan-based integrated circuit; wherein said clock type selector is a shift register.

13. The unified test controller of claim 1, wherein said capture clock generator for generating an ordered sequence of capture clocks (CCKs) further comprises means for generating a plurality of selected overlapping clock cycles and a plurality of selected non-overlapping clock cycles as said capture clocks (CCKs).

14. The unified test controller of claim 1, wherein said capture clock (CCK) in said domain clock generator is used to test or diagnose stuck-type faults, including stuck-at faults, bridging faults, or IDDQ (IDD Quiescent) faults, in said clock domain in said scan-based integrated circuit.

15. The unified test controller of claim 1, wherein said system clock in said domain clock generator is used to test or diagnose non-stuck-type faults, including transition faults using last-shift launch, transition faults using capture launch, path-delay faults using last-shift launch, path-delay faults using capture launch, multiple-cycle delay faults using last-shift launch, and multiple-cycle delay faults using capture launch, in said clock domain in said scan-based integrated circuit.

16. The unified test controller of claim 1, wherein said scan clocks (SCKs) are used to test or diagnose said scan-based integrated circuit embedded with a plurality of PRPG-MISR (pseudo-random pattern number and multiple-input signature register) pairs in said selected self-test mode; wherein a selected said PRPG-MISR pair can be further split into two or more smaller PRPG-MISR pairs; and wherein two or more selected said PRPG-MISR pairs can be further merged into a larger PRPG-MISR pair.

17. The unified test controller of claim 1, wherein said scan clocks (SCKs) are used to test or diagnose said scan-based integrated circuit embedded with a plurality of decompressor-compressor pairs in said selected scan-test mode; wherein a selected said decompressor-compressor pair can be further split into two or more smaller decompressor-compressor pairs; and wherein two or more selected said decompressor-compressor pairs can be further merged into a larger decompressor-compressor pair.

18. The unified test controller of claim 17, wherein said decompressor is selectively a reconfigured PRPG or broadcaster; and wherein said compressor is selectively a MISR or a compactor.

* * * * *